United States Patent
Hata

(10) Patent No.: US 8,330,330 B2
(45) Date of Patent: Dec. 11, 2012

(54) PIEZOELECTRIC ACTUATOR AND METHOD OF MANUFACTURING THE SAME

(75) Inventor: Kenjiro Hata, Tokyo (JP)

(73) Assignees: TDK Corporation, Tokyo (JP); SAE Magnetics (H.K.) Ltd., Hong Kong (CN)

( * ) Notice: Subject to any disclaimer, the term of this patent is extended or adjusted under 35 U.S.C. 154(b) by 437 days.

(21) Appl. No.: 12/791,154

(22) Filed: Jun. 1, 2010

(65) Prior Publication Data

US 2010/0301705 A1    Dec. 2, 2010

(30) Foreign Application Priority Data

Jun. 2, 2009  (JP) ................. P2009-133442

(51) Int. Cl.
*H01L 41/04* (2006.01)
*G11B 5/56* (2006.01)
(52) U.S. Cl. ............... 310/328; 310/367; 360/294.4
(58) Field of Classification Search ............ 310/328, 310/367; 360/294.4
See application file for complete search history.

(56) References Cited

U.S. PATENT DOCUMENTS

| | | | |
|---|---|---|---|
| 6,587,313 B2 * | 7/2003 | Kurihara et al. | 360/294.4 |
| 6,721,136 B2 * | 4/2004 | Kurihara et al. | 360/294.4 |
| 6,831,889 B2 | 12/2004 | Kuwajima et al. | |
| 6,856,070 B2 * | 2/2005 | Wang et al. | 310/317 |
| 6,917,498 B2 | 7/2005 | Kuwajima et al. | |
| 7,006,335 B2 | 2/2006 | Kuwajima et al. | |
| 7,027,267 B2 | 4/2006 | Kuwajima et al. | |
| 7,072,147 B2 | 7/2006 | Limmer et al. | |
| 7,072,149 B2 | 7/2006 | Kuwajima et al. | |
| 7,072,150 B2 | 7/2006 | Kuwajima et al. | |
| 2001/0040773 A1 | 11/2001 | Kurihara et al. | |
| 2004/0183403 A1 | 9/2004 | Uchiyama et al. | |

FOREIGN PATENT DOCUMENTS

| | | | |
|---|---|---|---|
| JP | A-4-313286 | | 11/1992 |
| JP | 2001327178 A | * | 11/2001 |
| JP | A-2001-327178 | | 11/2001 |
| JP | A-2002-134807 | | 5/2002 |
| JP | A-2004-289143 | | 10/2004 |

OTHER PUBLICATIONS

Translation of Japanese Office Action dated May 10, 2011 issued in Japanese Patent Application No. 2009-133442.

* cited by examiner

*Primary Examiner* — Jaydi San Martin
(74) *Attorney, Agent, or Firm* — Oliff & Berridge, PLC

(57) ABSTRACT

A piezoelectric actuator includes a supporting substrate, a main body having a first piezoelectric laminate, a second piezoelectric laminate, and a displacement portion, and a first elastic layer. The first elastic layer is fixed to the main body so as to connect a lower surface of the first piezoelectric laminate, a lower surface of the second piezoelectric laminate, a side surface of the first piezoelectric laminate, and a side surface of the second piezoelectric laminate. A first region to fourth region of the first elastic layer is fixed to the principal surface of the supporting substrate by a first to fourth bonding portions. A non-bonding surface is not fixed to the principal surface of the supporting substrate.

12 Claims, 16 Drawing Sheets

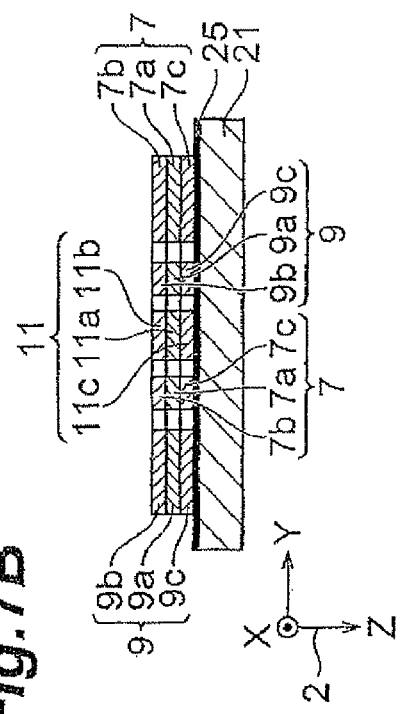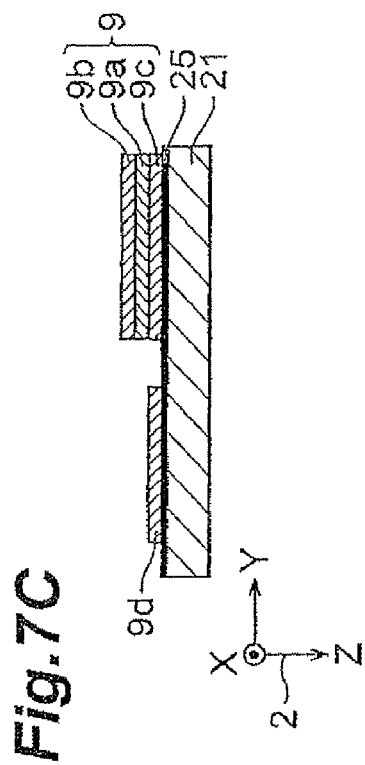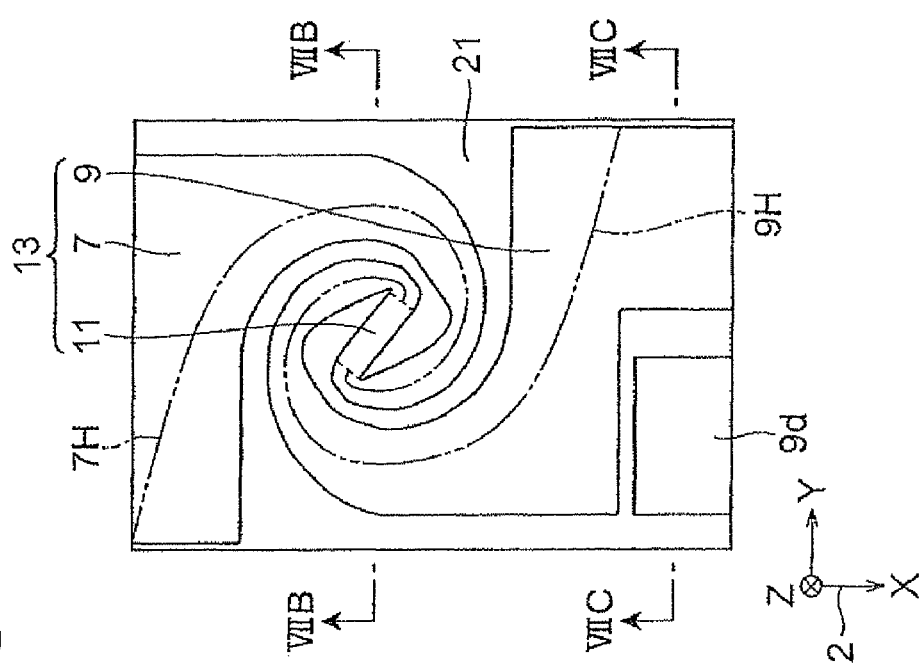

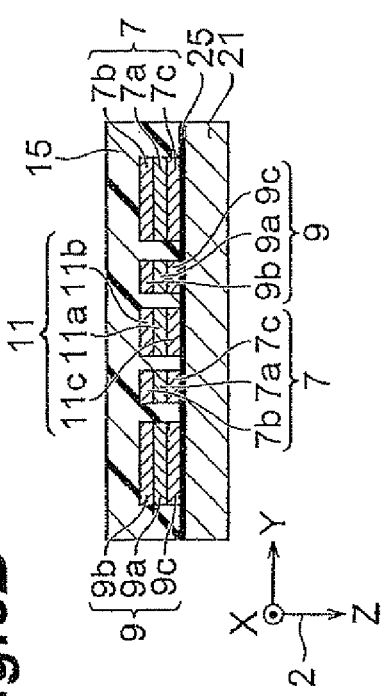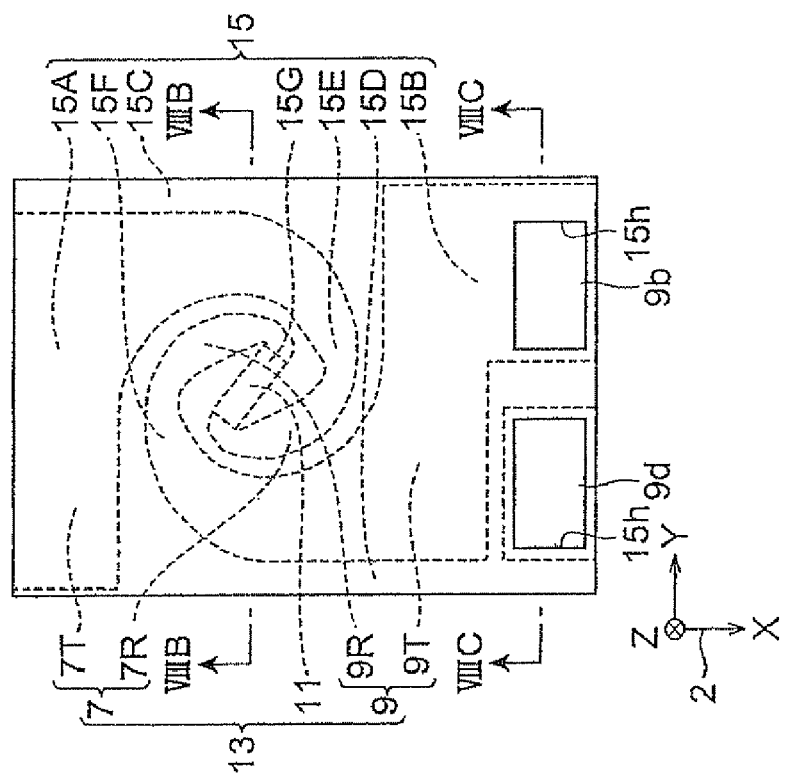

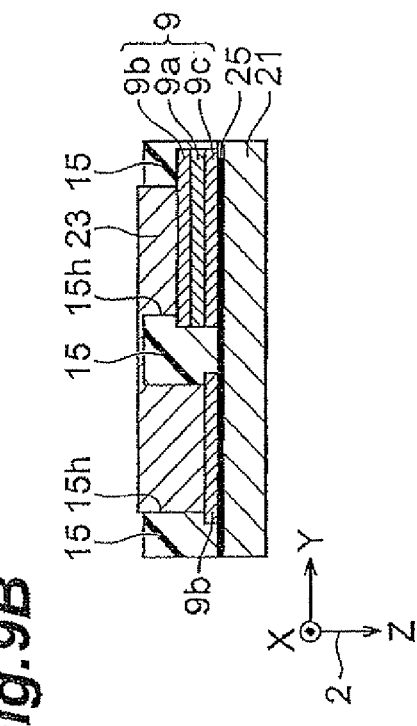
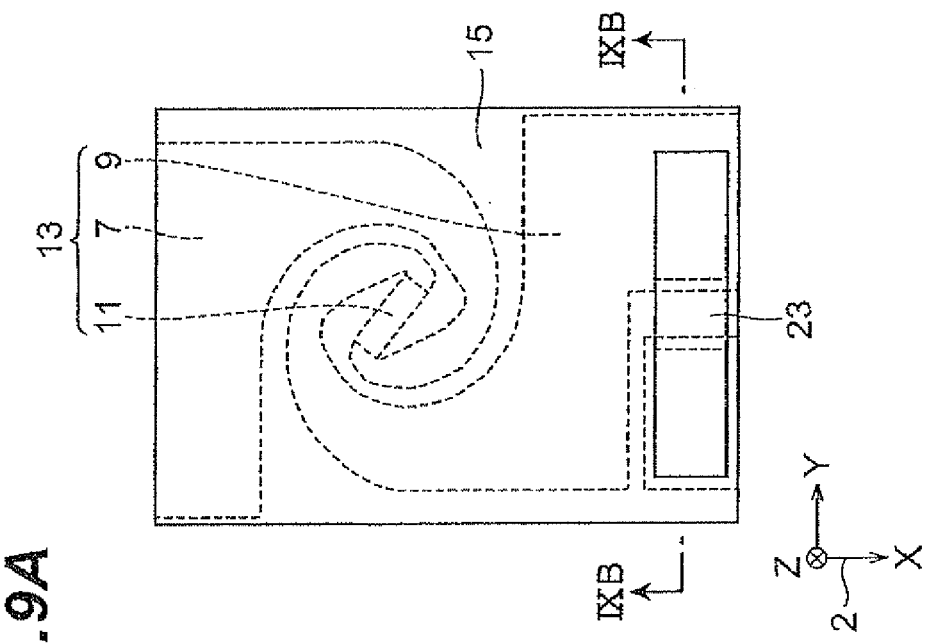

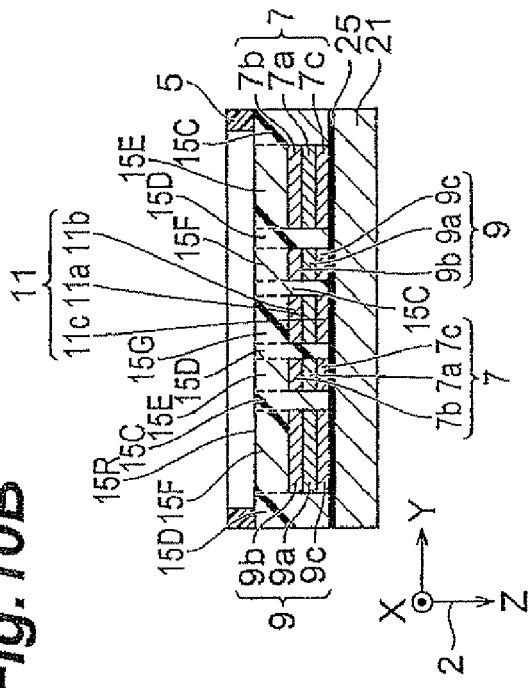
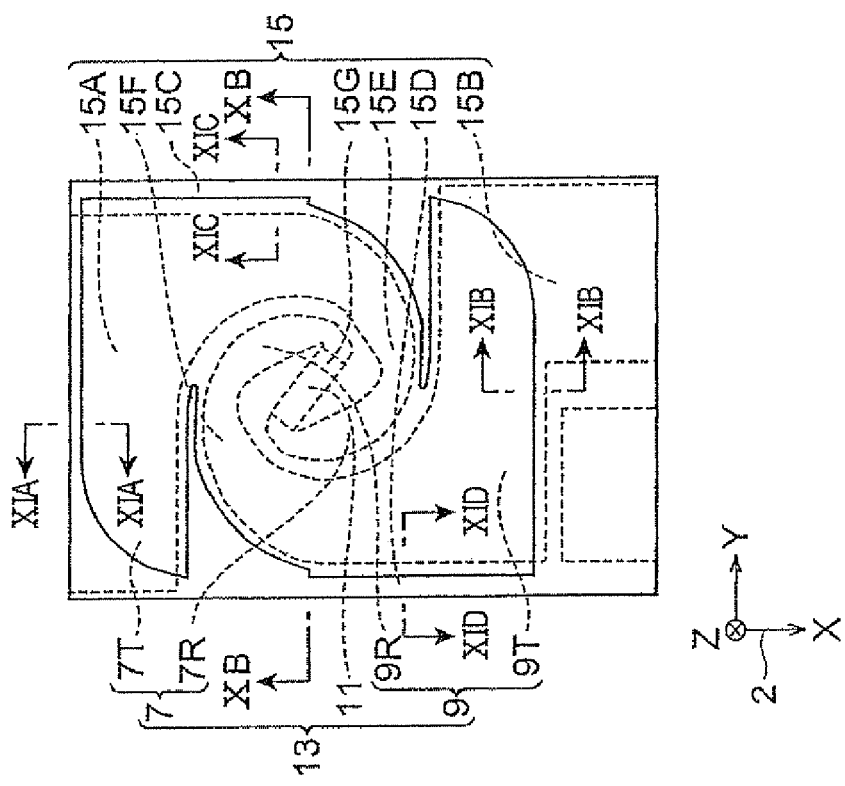
Fig. 10A
Fig. 10B

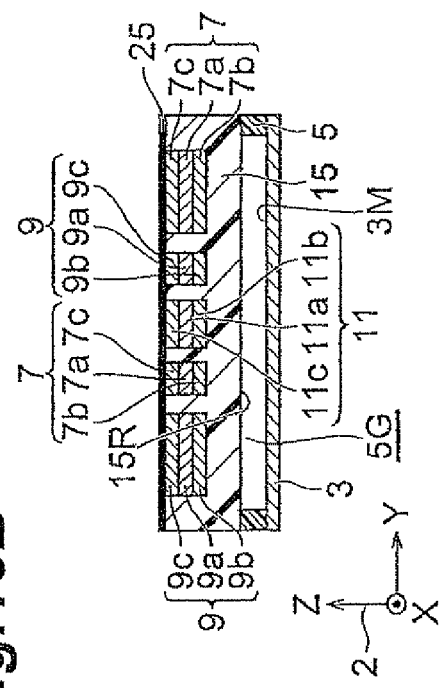
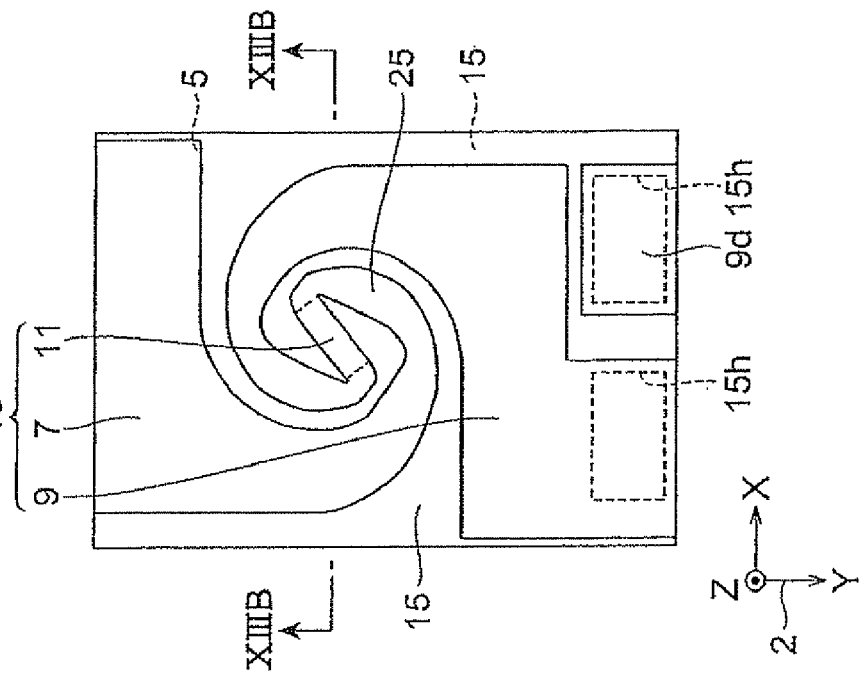

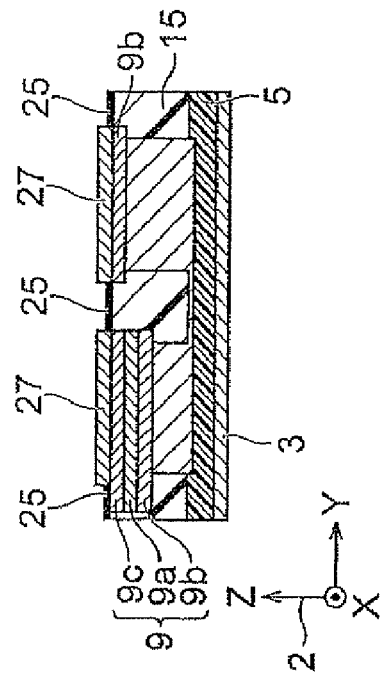
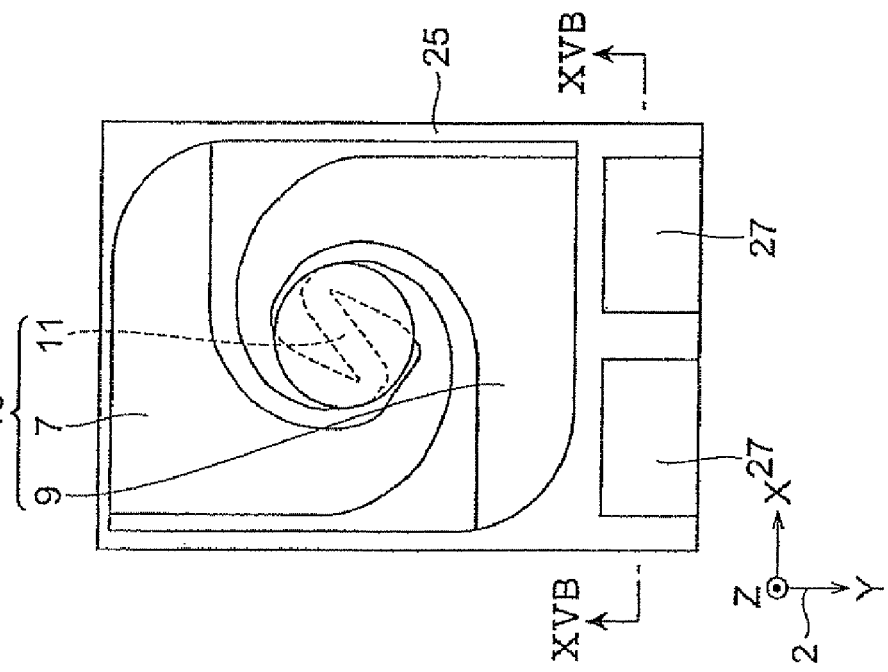

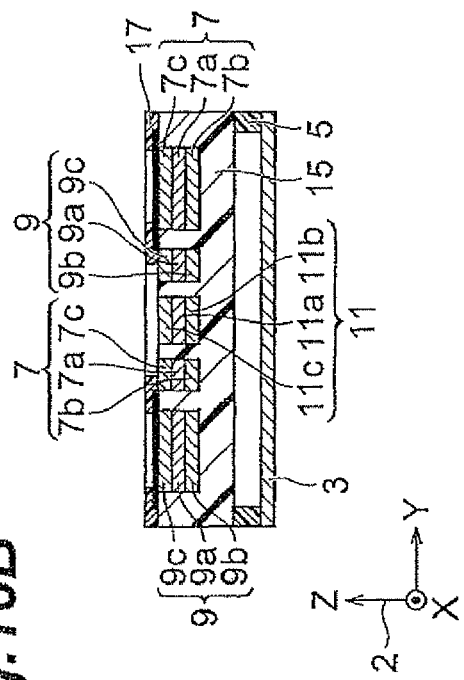
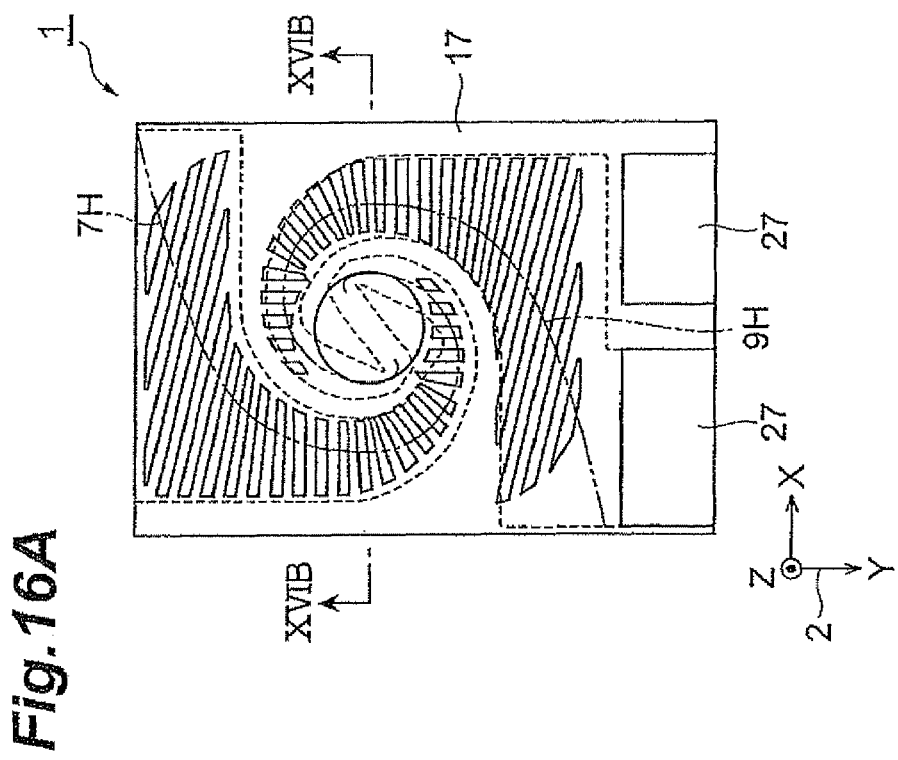

PIEZOELECTRIC ACTUATOR AND METHOD OF MANUFACTURING THE SAME

BACKGROUND OF THE INVENTION

1. Field of the Invention

The present invention relates to a piezoelectric actuator and a method of manufacturing the piezoelectric actuator.

2. Related Background Art

Japanese Unexamined Patent Application Publication No. 2002-134807 discloses a head supporting mechanism used for a magnetic disk drive. This head supporting mechanism includes a piezoelectric actuator which has a thin film piezoelectric element (piezoelectric laminate) as a displacement body. It is disclosed that it is possible to minutely displace a magnetic head fixed to a slider holding substrate, of the head supporting mechanism by this piezoelectric actuator, thereby positioning the magnetic head with high precision with respect to a magnetic disk.

Additionally, Japanese Unexamined Patent Application Publication No. 4-313286 discloses a ceramic actuator (piezoelectric actuator). This ceramic actuator includes a pair of piezoelectric bimorphs (piezoelectric laminates) serving as displacement bodies arranged to face each other on the same surface as cantilever structures, respectively, and a connecting body fitted to a front end of each of the pair of piezoelectric bimorphs. It is disclosed that that it is possible to displace the connecting bodies by the pair of piezoelectric bimorphs.

SUMMARY OF THE INVENTION

In the piezoelectric actuator disclosed in Japanese Unexamined Patent Application Publication No. 2002-134807, the thin film piezoelectric element which is a displacement body is bonded and fixed to a flexure which is a member adapted to make a head slider which is a displacement target into a predetermined form. A slider supporting plate to which the head slider which is a displacement target is fixed is connected to the flexure via a hinge portion. This converts linear displacement of the thin film piezoelectric element into rotational displacement of the slider supporting plate which has the hinge portion as a rotation center. High-precision head positioning is realized by a suspension structure which has such a piezoelectric actuator and flexure.

However, in the piezoelectric actuator disclosed in Japanese Unexamined Patent Application Publication No. 2002-134807, displacement of the thin film piezoelectric element is transmitted to the head slider which is a control target via a plurality of transmission mechanisms. Therefore, such a piezoelectric actuator has problems in that the overall structure of the actuator becomes complicated, the transmission efficiency of displacement decreases, or variation occurs in the amount displacement of the head slider which is a control target, due to deviation of the characteristics or dimensions of the transmission material for these transmission mechanisms.

In this regard, in the piezoelectric actuator disclosed in Japanese Unexamined Patent Application Publication No. 4-313286, the pair of piezoelectric bimorphs which are displacement bodies are supported by a substrate as a cantilever structure, and regions other than the portion fixed to the substrate in the pair of piezoelectric bimorphs do not come into contact with a member which hinders displacement. That is, the portions of the pair of piezoelectric bimorphs other than base ends fixed to the substrate are separated from the substrate. Additionally, the pair of piezoelectric bimorphs is directly fixed to the connecting body which is a displacement target. Therefore, the structure of the piezoelectric actuator becomes simple, and the transmission efficiency of displacement increases.

In the piezoelectric actuator in which the piezoelectric laminate which is a displacement body is supported by the substrate as a cantilever structure like the piezoelectric actuator disclosed in Japanese Unexamined Patent Application Publication No. 4-313286, in order to increase the amount of displacement of the displacement target, it is necessary to make the piezoelectric laminate into a longitudinal structure and to increase the length from the base end supported by the substrate of the piezoelectric laminate to the displacement body. However, in the piezoelectric actuator which has a structure in which a portion of the piezoelectric laminate is separated from the substrate, support of the piezoelectric laminate by the substrate becomes insufficient when the length of the piezoelectric laminate is increased in this way. Therefore, it becomes difficult to displace the displacement target precisely due to a situation where the piezoelectric laminate may be displaced independently of the inverse piezoelectric effect, or a situation where the piezoelectric laminate may be displaced in an unexpected form. Therefore, there are problems in that the compatibility between increasing the amount of displacement of the displacement target and displacing the displacement target precisely is difficult.

The present invention was made in view of such problems, and the object thereof is to provide a piezoelectric actuator in which the structure is simple, the transmission efficiency of displacement is high, and a displacement target can be precisely displaced while the amount of displacement of the displacement target is increased, and a method of manufacturing such a piezoelectric actuator.

In order to achieve the above object, a piezoelectric actuator relating to the present invention includes: a supporting substrate; a main body having a first piezoelectric laminate including a first upper electrode layer, a first lower electrode layer, and a first piezoelectric layer interposed between the electrode layers, a second piezoelectric laminate including a second upper electrode layer, a second lower electrode layer, and a second piezoelectric layer interposed between the electrode layers, and a displacement portion capable of being displaced relative to the supporting substrate; and a first elastic layer. The main body is provided above a principal surface of the supporting substrate. The first piezoelectric laminate has a direction which intersects the principal surface of the supporting substrate as a lamination direction, and extends along a first imaginary line within a plane parallel to the principal surface of the supporting substrate. The second piezoelectric laminate has a direction which intersects the principal surface of the supporting substrate as a lamination direction, extends along a second imaginary line within the plane parallel to the principal surface of the supporting substrate, and is spaced apart from the first piezoelectric laminate. The displacement portion is fixed between the front end of the first piezoelectric laminate and the front end of the second piezoelectric laminate. The first elastic layer is fixed to the main body so as to connect a lower surface of the first piezoelectric laminate which faces the supporting substrate, a lower surface of the second piezoelectric laminate which faces the supporting substrate, a portion of a side surface of the first piezoelectric laminate, and at least a portion of a side surface of the second piezoelectric laminate. A first region of the first elastic layer provided on a lower surface of a base end of the first piezoelectric laminate is fixed to the principal surface of the supporting substrate by a first bonding portion. A second region of the first elastic layer provided on a lower surface of a base end of the second piezoelectric laminate is fixed to the principal surface of the supporting substrate by a second bonding portion. At least a portion of a third region of the first elastic layer provided on a side surface of the first piezoelectric laminate is fixed to the principal surface of the supporting substrate by a third bonding portion. At least a portion of a fourth region of the first elastic layer provided on the side surface of the second piezoelectric laminate is fixed to the principal surface of the supporting substrate by a fourth bonding portion. A non-bonding surface other than surfaces, which come in contact with the first bonding portion, the second bonding portion, the third bonding portion, and the fourth bonding portion, in the lower surface of the first elastic layer which faces the supporting substrate, is not fixed to the principal surface of the supporting substrate, or is fixed to the principal surface of the supporting substrate by a member whose modulus of elasticity is lower than the first bonding portion, the second bonding portion, the third bonding portion, and the fourth bonding portion.

In the piezoelectric actuator relating to the present invention, the first piezoelectric laminate is fixed to the principal surface of the supporting substrate by the first bonding portion via the first region of the first elastic layer only at the base end, and the second piezoelectric laminate is fixed to the principal surface of the supporting substrate by the second bonding portion via the second region of the first elastic layer only at the base end, and the first piezoelectric laminate and the second piezoelectric laminate are fixed above the principal surface of the supporting substrate. Additionally, the first elastic layer is fixed to the lower surface and side surface of the first piezoelectric laminate and the second piezoelectric laminate, and the non-bonding surface of the first elastic layer is not fixed to the principal surface of the supporting substrate, or is fixed to the principal surface of the supporting substrate by a member whose modulus of elasticity is lower than the first bonding portion, the second bonding portion, the third bonding portion, and the fourth bonding portion. Thereby, the first piezoelectric laminate and the second piezoelectric laminate are not fixed to a high-rigidity member for support in portions other than the base ends thereof. Additionally, the displacement portion which is a displacement target is directly fixed between the front end of the first piezoelectric laminate and the front end of the second piezoelectric laminate. As a result, the piezoelectric actuator relating to the present invention has a simple structure and high transmission efficiency of displacement.

Moreover, the piezoelectric actuator relating to the present invention further includes a first elastic layer which connects the lower surface and side surface of the first piezoelectric laminate and second piezoelectric laminate, and the first elastic layer is fixed to the principal surface of the supporting substrate, in the first region, the second region, the third region, and the fourth region. Thereby, the lower surfaces and side surfaces of the front end of the first piezoelectric laminate and the front end of the second piezoelectric laminate are indirectly supported on the principal surface of the supporting substrate by the first elastic layer. Additionally, since the first elastic layer is made of an elastic material, the displacement of the first piezoelectric laminate and the second piezoelectric laminate is hardly hindered, compared to a case where the lower surfaces or side surfaces of the front end of the first piezoelectric laminate and front end of the second piezoelectric laminate are directly supported by a high-rigidity member. Therefore, even if the shapes of the first piezoelectric laminate and the second piezoelectric laminate extend for long along the first imaginary line and the second imaginary line, respectively, the first piezoelectric laminate and the second piezoelectric laminate can be sufficiently supported by the supporting substrate. Therefore, it is possible to suppress a situation where the first piezoelectric laminate and the second piezoelectric laminate may be displaced independently of an inverse piezoelectric effect, or may be displaced in an unexpected form. As a result, the piezoelectric actuator relating to the present invention allows for the compatibility between increasing the amount of displacement of the displacement portion which is a displacement target, and displacing the displacement portion precisely.

From the foregoing, according to the piezoelectric actuator relating to the present invention, the structure is simple, the transmission efficiency of displacement, is high, and a displacement target can be precisely displaced while increasing the amount of displacement of the displacement target.

Moreover, in the piezoelectric actuator relating to the present invention, it is preferable that a space gap which comes in contact with the non-bonding surface be formed between the non-bonding surface, and the principal surface of the supporting substrate. This further reduces the factors which block displacement of the first piezoelectric laminate and the second piezoelectric laminate. As a result, the transmission efficiency of displacement becomes much higher in the piezoelectric actuator relating to the present invention.

Preferably, the piezoelectric actuator relating to the present invention further includes a second elastic layer fixed to the main body so as to connect regions above the first bonding portion, the second bonding portion, the third bonding portion, and the fourth bonding portion, the upper surface of the first piezoelectric laminate, and the upper surface of the second piezoelectric laminate, in the upper surface of the first elastic layer.

Thereby, the upper surfaces of the first piezoelectric laminate and second piezoelectric laminate are indirectly supported on the principal surface of the supporting substrate by the second elastic layer. Additionally, since the second elastic layer is made of an elastic material, the displacement of the first piezoelectric laminate and the second piezoelectric laminate is hardly hindered, compared to a case where the upper surfaces of the first piezoelectric laminate and second piezoelectric laminate are directly supported by the supporting, member. Therefore, it is possible to suppress a situation where the first piezoelectric laminate and the second piezoelectric laminate may be displaced independently of an inverse piezoelectric effect, or may be displaced in an unexpected form. As a result, it is possible to further increase the amount of displacement of the displacement portion which is a displacement target and to displace the displacement portion more precisely.

Moreover, in the piezoelectric actuator relating to the present invention, it is preferable that the first elastic layer be made of resin, and the second elastic layer be made of resin.

In the piezoelectric actuator relating to the present invention, preferably a tangent line in at least some portions of the first imaginary line rotates in a rotational direction with a direction which intersects the principal surface of the supporting substrate as a rotational axis, in a plane parallel to the principal surface of the supporting substrate, as the tangent point thereof moves from an end point of the first imaginary line corresponding to a base end of the first piezoelectric laminate toward an end point thereof corresponding to a front end of the first piezoelectric laminate, and a tangent line in at least some portions of the second imaginary line rotates in a rotational direction with a direction which intersects the principal surface of the supporting substrate as a rotational axis, in the plane parallel to the principal surface of the supporting substrate, as the tangent point thereof moves from an end point of the second imaginary line corresponding to the base end of the second piezoelectric laminate toward an end point thereof corresponding to the front end, of the second piezoelectric laminate.

Thereby, at least portions of the first piezoelectric laminate and second piezoelectric laminate have shapes which extend while curvilinearly bending along a rotational direction having a direction which intersects the principal surface of the supporting substrate as a rotational axis. Therefore, the shape of the whole piezoelectric actuator can be made small while keeping equal the amount of displacement of the displacement portion, as compared to a case where the first piezoelectric laminate and the second piezoelectric laminate have shapes which linearly extend by the same length.

In the piezoelectric actuator relating to the present invention, the first piezoelectric laminate and the second piezoelectric laminate are fixed to the displacement portion, respectively, so that the displacement portion is rotated in a first rotational direction with a direction which intersects the principal surface of the supporting substrate as a rotational axis, when the first piezoelectric laminate extends along the first imaginary line, and simultaneously the second piezoelectric laminate extends along the second imaginary line.

Thereby, it is possible to rotate the displacement portion in the first rotational direction.

In the piezoelectric actuator relating to the present invention, preferably, a tangent line in at least a portion of the first imaginary line corresponding to the front end of the first piezoelectric laminate rotates in the first rotational direction in the plane parallel to the principal surface of the supporting substrate, as the tangent point thereof moves from an end point of the first imaginary line corresponding to the base end of the first piezoelectric laminate toward an end point thereof corresponding to the front end of the first piezoelectric laminate, and a tangent line in at least a portion of the second imaginary line corresponding to the front end of the second piezoelectric laminate rotates in the first rotational direction in the plane parallel to the principal surface of the supporting substrate, as the tangent point thereof moves from an end point of the second imaginary line corresponding to the base end of the second piezoelectric laminate toward an end point thereof corresponding to the front end, of the second piezoelectric laminate.

Thereby, when the first piezoelectric laminate is expanded and contracted along the first imaginary line, the front end of the first piezoelectric laminate expands and contracts along the first rotational direction. Similarly, when the second piezoelectric laminate is expanded and contracted along the second imaginary line, the front end of the second piezoelectric laminate expands and contracts along the first rotational direction. As a result, the transmission efficiency of the displacement when the displacement portion is rotated becomes much higher.

In the piezoelectric actuator relating to the present invention, preferably, at least the portion of the first imaginary line corresponding to the front end of the first piezoelectric laminate, and at least the portion of the second imaginary line corresponding to the front end of the second piezoelectric laminate are arranged substantially point-symmetrically with respect to a point within the displacement portion as seen from a direction vertical to the principal surface of the supporting substrate.

Therefore, the front end of the first piezoelectric laminate and the front end of the second piezoelectric laminate expand and contract substantially point-symmetrically with respect to the above point in the displacement portion. As a result, the transmission efficiency of the displacement when the displacement portion is rotated becomes much higher.

In the piezoelectric actuator relating to the present invention, preferably, the displacement portion includes a third upper electrode layer, a third lower electrode layer, and a third piezoelectric layer, the first piezoelectric layer, the second piezoelectric layer, and the third piezoelectric layer are integrally formed, the first upper electrode layer, the second upper electrode layer, and the third upper electrode layer are integrally formed, and the first lower electrode layer, the second lower electrode layer, and the third lower electrode layer are integrally formed. This makes it possible to simplify the overall structure of the piezoelectric actuator.

In the piezoelectric actuator relating to the present invention, preferably, the second elastic layer is formed with a first slit structure composed of a plurality of slits which extend in directions which intersect the first imaginary line, respectively, and are aligned along the first imaginary line, and a second slit structure composed of a plurality of slits which extend in directions which intersect the second imaginary line, respectively, and are aligned along the second imaginary line.

Thereby, the first piezoelectric laminate easily expands and contracts along the first imaginary line, and the second piezoelectric laminate easily expands and contracts along the second imaginary line. As a result, it is possible to further increase the transmission efficiency of displacement.

Further, a method of manufacturing a piezoelectric actuator relating to the present invention includes the steps of: (a) forming on a temporary substrate, a main body having a first piezoelectric laminate including a first upper electrode layer, a first lower electrode layer, and a first piezoelectric layer interposed between the first upper electrode layer and the first lower electrode layer, and extending along a first imaginary line within a plane parallel to a principal surface of the temporary substrate, a second piezoelectric laminate including a first upper electrode layer, a first lower electrode layer, and a second piezoelectric layer interposed between the first upper electrode layer and the first lower electrode layer, extending along a second imaginary line within the plane parallel to the principal surface of the temporary substrate, and spaced apart from the first piezoelectric laminate, and a displacement portion fixed between a front end of the first piezoelectric laminate and a front end of the second piezoelectric laminate; (b) forming a first elastic layer on the main body so as to cover the main body; (c) forming a bonding layer having a pattern which covers a first region of the first elastic layer provided on a base end of the first piezoelectric laminate, a second region of the first elastic layer provided on a base end of the second piezoelectric laminate, at least a portion of a third region of the first elastic layer provided on a side surface of the first piezoelectric laminate, and at least a portion of a fourth region of the first elastic layer provided on the side surface of the second piezoelectric laminate and which exposes the first elastic layer other than these regions; (d) fixing a supporting substrate on the bonding layer so as to form a space gap which comes in contact with a non-bonding surface between the non-bonding surface of the first elastic layer where the bonding layer is not formed, and the principal surface of the supporting substrate; and (e) removing the temporary substrate.

In the method of manufacturing a piezoelectric actuator relating to the present invention, in the piezoelectric actuator obtained, the first piezoelectric laminate is fixed to the principal surface of the supporting substrate by the first bonding portion via the first region of the first elastic layer only at the base end, and the second piezoelectric laminate is fixed to the principal surface of the supporting substrate by the second bonding portion via the second region of the first elastic layer only at the base end, and the first piezoelectric laminate and the second piezoelectric laminate are fixed above the principal surface of the supporting substrate. Additionally, the first elastic layer is fixed to the lower surfaces and side surfaces of the first piezoelectric laminate and the second piezoelectric laminate, and the space gap which comes in contact with the non-bonding portion is formed between the non-bonding surface of the first elastic layer, and the principal surface of the supporting substrate. Therefore, the first piezoelectric laminate and the second piezoelectric laminate do not come into contact with a high-rigidity member for support in portions other than the base ends thereof. Additionally, the displacement portion which is a displacement target is directly fixed between the front end of the first piezoelectric laminate and the front end of the second piezoelectric laminate. As a result, according to the method of manufacturing a piezoelectric actuator relating to the present invention, a piezoelectric actuator with simple structure and a high transmission efficiency of displacement is obtained.

Moreover, according to the method of manufacturing a piezoelectric actuator relating to the present invention, the piezoelectric actuator obtained further includes a first elastic layer which connects the lower surfaces and side surfaces of the first piezoelectric laminate and second piezoelectric laminate, and the first elastic layer is fixed to the principal surface of the supporting substrate, in the first region, the second region, the third region, and the fourth region. Thereby, the lower surfaces and side surface of the first piezoelectric laminate and second piezoelectric laminate are indirectly supported on the principal surface of the supporting substrate by the first elastic layer. Additionally, since the first elastic layer is made of an elastic material, the displacement of the first piezoelectric laminate and the second piezoelectric laminate is hardly hindered, compared to a case where the lower surfaces and side surfaces of the first piezoelectric laminate and second piezoelectric laminate are directly supported by the supporting member. Therefore, even if the shapes of the first piezoelectric laminate and the second piezoelectric laminate extend for long along the first imaginary line and the second imaginary line, respectively, the first piezoelectric laminate and the second piezoelectric laminate can be sufficiently supported by the supporting substrate. Therefore, it is possible to suppress a situation where the first piezoelectric laminate and the second piezoelectric laminate may be displaced independently of an inverse piezoelectric effect, or may be displaced in an unexpected form. As a result, according to the method of manufacturing a piezoelectric actuator relating to the present invention, a piezoelectric actuator is obtained which allows for the compatibility between increasing the amount of displacement of the displacement portion which is a displacement target, and displacing the displacement portion precisely.

From the foregoing, according to the method of manufacturing a piezoelectric actuator relating to the present invention, a piezoelectric actuator is obtained in which structure is simple, the transmission efficiency of displacement is high, and a displacement target can be precisely displaced while the amount of displacement of the displacement target is increased.

Preferably, the method of manufacturing a piezoelectric actuator further includes the step of: (f) after step (e), forming a second elastic layer on the first piezoelectric laminate, the second piezoelectric laminate, and the first elastic layer, which have been exposed by removing the temporary substrate in step (e), so as to connect a region above the bonding layer in the exposed surface of the first elastic layer, an upper surface of the first piezoelectric laminate, and an upper surface of the second piezoelectric laminate.

Thereby, in the piezoelectric actuator obtained, the first piezoelectric laminate and second piezoelectric laminate are indirectly supported on the principal surface of the supporting substrate by the second elastic layer. Additionally, since the second elastic layer is made of an elastic material, the displacement of the first piezoelectric laminate and the second piezoelectric laminate is hardly hindered, compared to a case where the upper surfaces of the first piezoelectric laminate and second piezoelectric laminate are directly supported by a high-rigidity member. Therefore, even if the shapes of the first piezoelectric laminate and the second piezoelectric laminate extend for long along the first imaginary line and the second imaginary line, respectively, the first piezoelectric laminate and the second piezoelectric laminate can be sufficiently supported by the supporting substrate. Therefore, it is possible to suppress a situation where the first piezoelectric laminate and the second piezoelectric laminate may be displaced independently of an inverse piezoelectric effect, or may be displaced in an unexpected form. As a result, a piezoelectric actuator capable of further increasing the amount of displacement of the displacement portion which is a displacement target and displace the displacement portion more precisely is obtained.

According to the present invention, a piezoelectric actuator in which the structure is simple, the transmission efficiency of displacement is high, and a displacement target can be precisely displaced while the amount of displacement of the displacement target is increased, and a method of manufacturing such a piezoelectric actuator are provided.

BRIEF DESCRIPTION OF ME DRAWINGS

FIG. 7A is a plan view for explaining a method of manufacturing the piezoelectric actuator of the embodiment, FIG. 7B is a sectional view along a line VIIB-VIIB in FIG. 7A, and FIG. 7C is a sectional view along a line VIIC-VIIC in FIG. 7A.

FIG. 8A is a plan view for explaining the method of manufacturing the piezoelectric actuator of the embodiment, FIG. 8B is a sectional view along a line VIIIB-VIIIB in FIG. 8A, and FIG. 8C is a sectional view along a VIIIC-VIIIC in FIG. 8A.

FIG. 9A is a plan view for explaining the method of manufacturing the piezoelectric actuator of the embodiment, and FIG. 9B is a sectional view along a line IXB-IXB in FIG. 9A.

FIG. 10A is a plan view for explaining the method of manufacturing the piezoelectric actuator of the embodiment, and FIG. 10B is a sectional view along a line XB-XB of FIG. 10A.

FIG. 13A is a plan view for explaining the method of manufacturing the piezoelectric actuator of the embodiment, and FIG. 13B is a sectional view along a line XIIIB-XIIIB of FIG. 13A.

FIG. 15A is a plan view for explaining the method of manufacturing the piezoelectric actuator of the embodiment, and FIG. 15B is a sectional view along a line XVB-XVB of FIG. 15A.

FIG. 16A is a plan view for explaining the method of manufacturing the piezoelectric actuator of the embodiment, and FIG. 16B is a sectional view along a line XVIB-XVIB of FIG. 16A.

DESCRIPTION OF THE PREFERRED EMBODIMENTS

Figure 1:
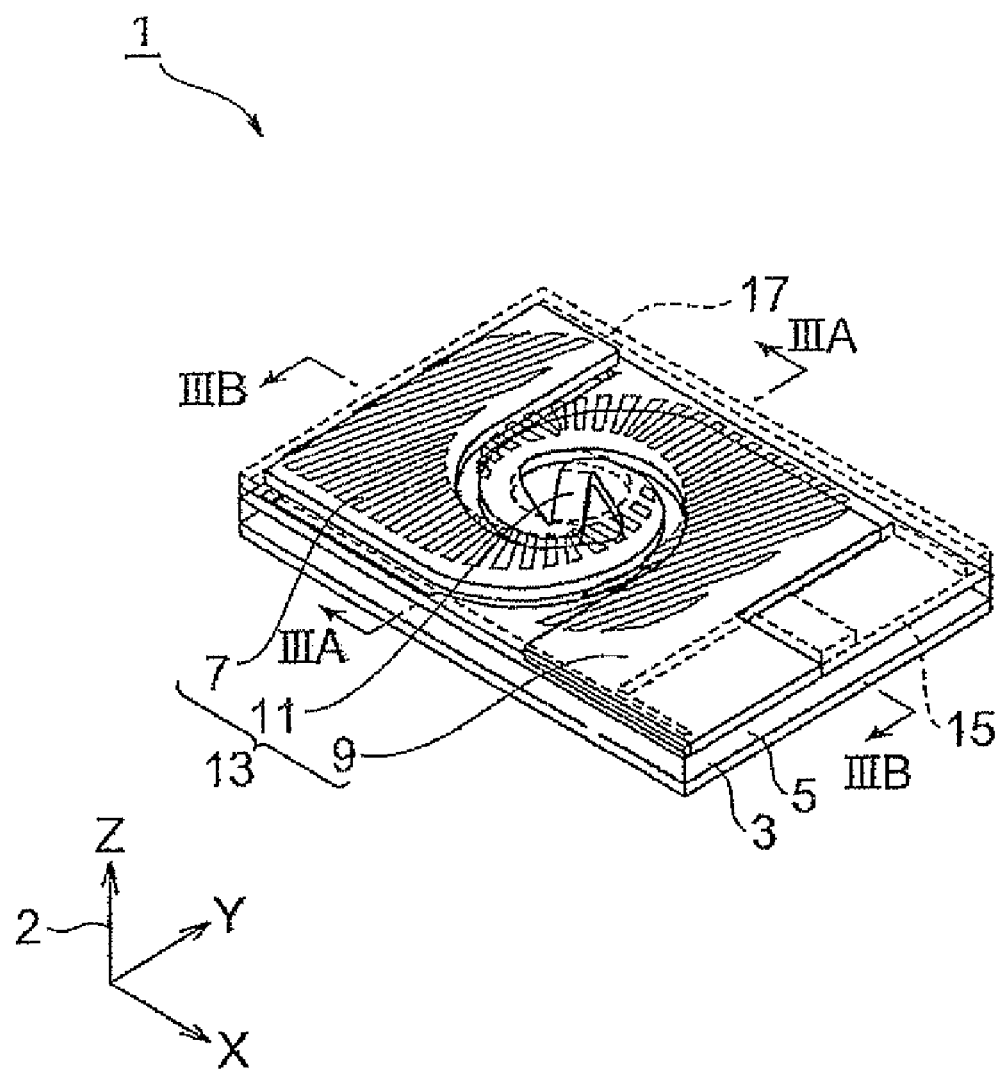
FIG. 1 is a perspective view of a piezoelectric actuator of an embodiment.

A piezoelectric actuator according to an embodiment, and a method of manufacturing the piezoelectric actuator will be described below in detail, referring to the accompanying drawings. In addition, in the respective drawings, the same reference numerals are used for the same elements if possible. Additionally, dimensional ratios in constituent elements and between constituent elements components in the drawings are arbitrary for the purpose of the viewability of the drawings.

First, a piezoelectric actuator according to the present embodiment will be described.

Figure 2:
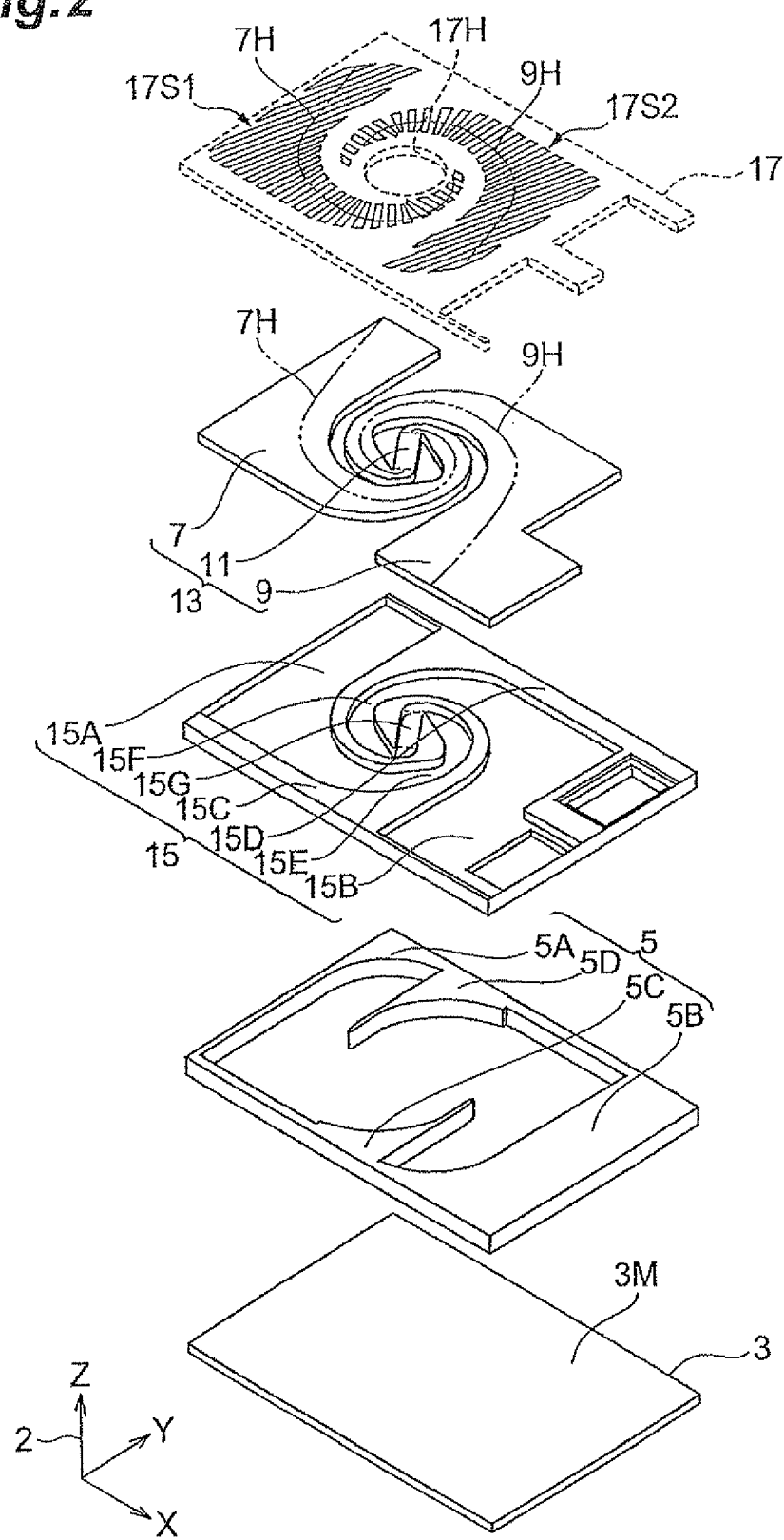
FIG. 2 is an exploded perspective view of the piezoelectric actuator of the embodiment.

FIG. 1 is a perspective view of the piezoelectric actuator of the present embodiment, and FIG. 2 is an exploded perspective view of the piezoelectric actuator of the present embodiment.

As shown in FIGS. 1 and 2, the piezoelectric actuator 1 of the present embodiment mainly includes a supporting substrate 3, a bonding layer 5, a main body 13, a first elastic layer 15, and a second elastic layer 17. The bonding layer 5, the main body 13, the first elastic layer 15, and the second elastic layer 17 are laminated on a principal surface 3M of the supporting substrate 3. In addition, in FIGS. 1 and 2, the second elastic layer 17 is shown by a broken line.

The supporting substrate 3 is a substrate made of silicone, glass, metal such as stainless steel, or the like. The supporting substrate 3 has high rigidity, and has higher rigidity than that of the first elastic layer 15 and the second elastic layer 17. In addition, an orthogonal coordinate system 2 is shown in FIG. 1 and FIG. 2, the thickness direction of the supporting substrate 3 is set to a Z-axis direction, and an X-axis and a Y-axis are set in directions parallel to the principal surface 3M of the supporting substrate 3. In the respective drawings after FIGS. 3A and 3B, the orthogonal coordinate system 2 is also shown if necessary.

Although the length of the supporting substrate 3 in the X-axis direction and the length of the supporting substrate in the Y-axis direction are not particularly limited, the lengths can be set to, for example, 1 mm to 5 mm and 0.5 mm to 3 mm, respectively. Although the thickness of the supporting substrate 3 in the Z-axis direction is not particularly limited, the thickness can be set to, for example, 0.05 mm to 2 mm.

The bonding layer 5 is laminated on the principal surface 3M. The bonding layer 5 is a layer for fixing the supporting substrate 3 and the first elastic layer 15, and is formed from, for example, an adhesive, such as polyimide, epoxy, or acrylic. Although the thickness of the bonding layer 5 in the Z-axis direction is not particularly limited, the thickness can be, for example, 1 μm to 50 μm. The supporting substrate 3 and the first elastic layer 15 can be surely fixed together by such a bonding layer 5.

As shown in FIG. 2, the bonding layer 5 is composed of a first bonding portion 5A which is provided at the end of the principal surface 3M at the negative side of the X-axis, a second bonding portion 5B which is provided at the end of the principal surface 3M at the positive side of the X-axis, a third bonding portion 5C which is provided at the end of the principal surface 3M at the negative side of the Y-axis, and a fourth bonding portion 5D which is provided at the end of the principal surface 3M at the positive side of the Y-axis. In this way, the bonding layer 5 has a pattern which covers only a portion of the principal surface 3M.

Figure 4:
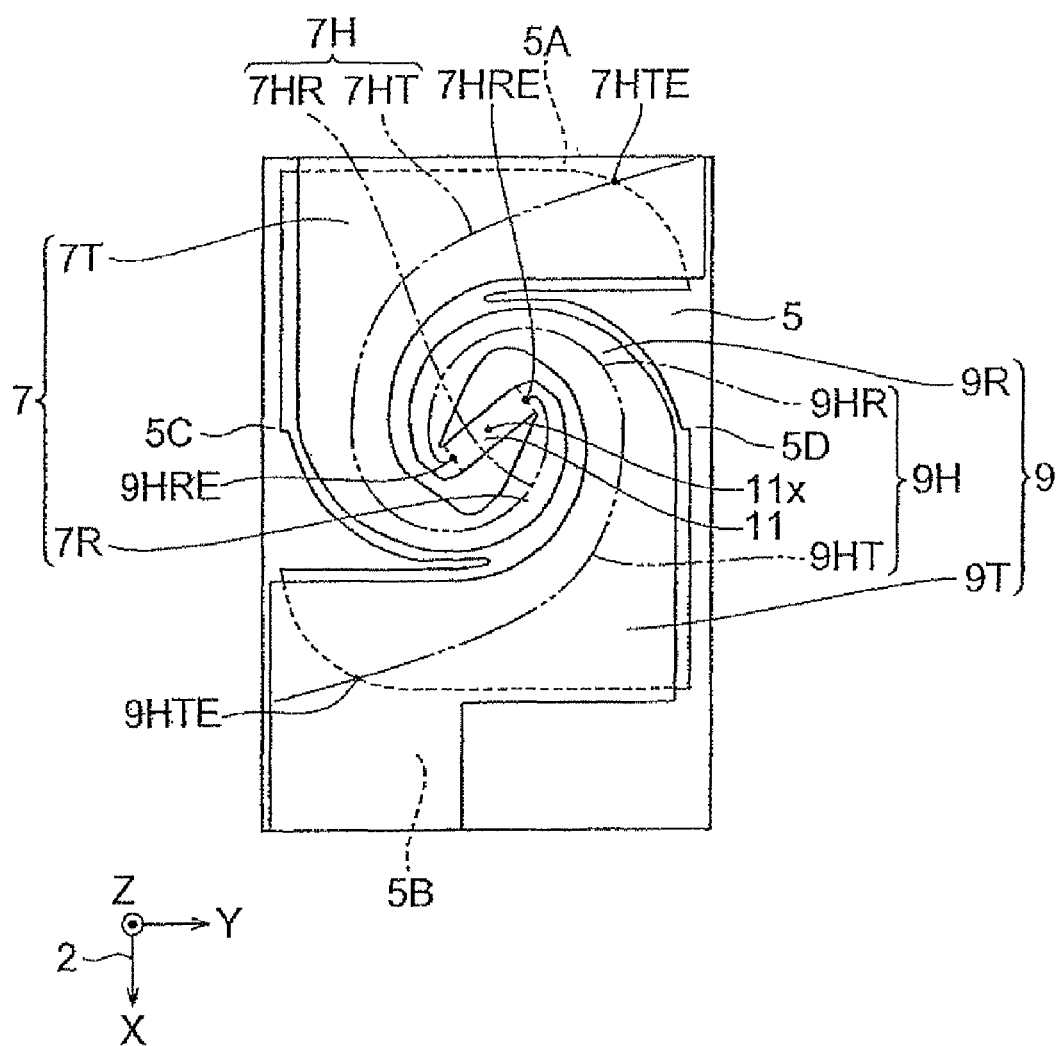
FIG. 4 is a plan view showing only a bonding layer, a first piezoelectric laminate, a second piezoelectric laminate, and a displacement portion in the piezoelectric actuator.

As shown in FIGS. 1 and 2, the main body 13 has a first piezoelectric laminate 7, a second piezoelectric laminate 9, and a displacement portion 11. Further, as shown in FIGS. 2 and 4, the first piezoelectric laminate 7 is composed of a base end 7T which is provided above the end of the principal surface 3M at the negative side of the X-axis, and a front end 7R which is provided continuously with the base end 7T and provided closer to the positive direction of the X-axis than the base end 7T. The second piezoelectric laminate 9 is composed of a base end 9T which is provided above the end of the principal surface 3M at the positive side of the X-axis, and a front end 9R which is provided continuously with the base end 9T and provided closer to the negative direction of the X-axis than the base end 9T. The first piezoelectric laminate 7 and the second piezoelectric laminate 9 are spaced apart, and the displacement portion 11 is fixed between the front end 7R and the front end 9R.

Figure 3A:
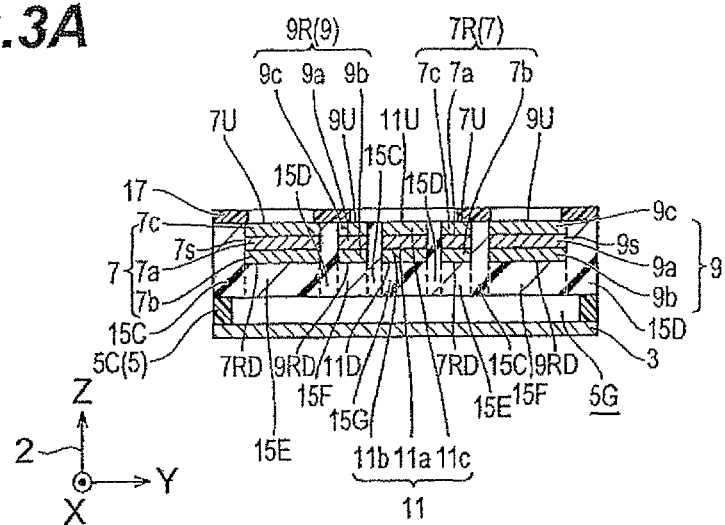
FIG. 3A is a sectional view of the piezoelectric actuator along a line IIIA-IIIA of FIG. 1.
Figure 3B:
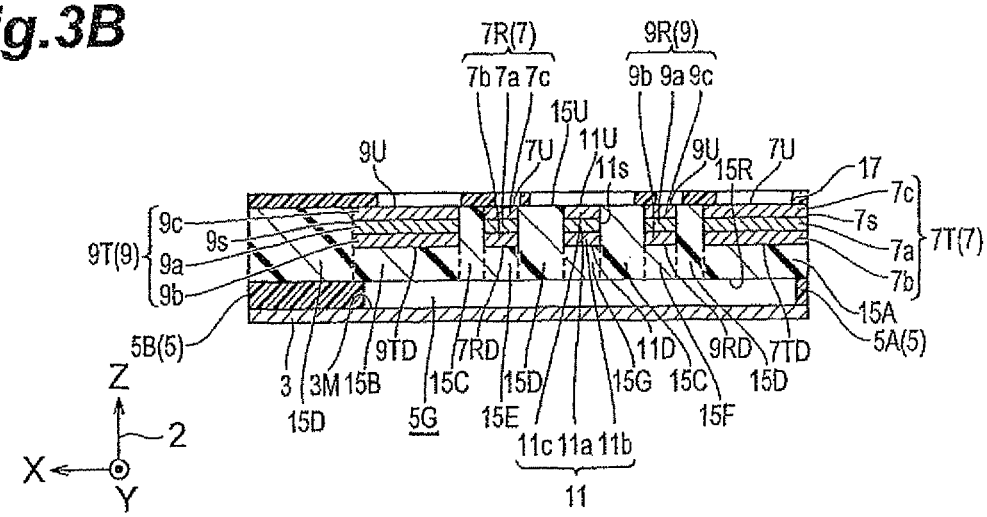
FIG. 3B is a sectional view of the piezoelectric actuator along a line IIIB-IIIB of FIG. 1.

The shapes of the first piezoelectric laminate 7, the second piezoelectric laminate 9, and the displacement portion 11 will be described in more detail. FIG. 3A is a sectional view of the piezoelectric actuator along a line IIIA-IIIA of FIG. 1, and FIG. 3B is a sectional view of the piezoelectric actuator along a line of FIG. 1. FIG. 4 is a plan view showing only the bonding layer, the first piezoelectric laminate, the second piezoelectric laminate, and the displacement portion in the piezoelectric actuator.

As shown in FIGS. 3A and 3B, the first piezoelectric laminate 7 is a laminate which has a lamination direction in the Z-axis direction. The first piezoelectric laminate 7 includes a first piezoelectric layer 7a, and the first piezoelectric layer 7a is interposed between a first upper electrode layer 7b and a first lower electrode layer 7c. Similarly, the second piezoelectric laminate 9 is a laminate which has a lamination direction in the Z-axis direction. The second piezoelectric laminate 9 includes a second piezoelectric layer 9a, and the second piezoelectric layer 9a is interposed between a second upper electrode layer 9b and a second lower electrode layer 9c. Similarly, in the present embodiment, the displacement portion 11 is a laminate which has a lamination direction in the Z-axis direction. The displacement portion 11 includes a third piezoelectric layer 11a, and the third piezoelectric layer 11a is interposed between a third upper electrode layer 11b and a third lower electrode layer 11c.

The first piezoelectric layer 7a, the second piezoelectric layer 9a, and the third piezoelectric layer 11a are made of materials having piezoelectricity, respectively, and is made of, for example, ferroelectric materials, such as titanic acid lead zirconate ($Pb(Zr_X, Ti_{1-X})O_3$), and barium titanate ($BaTiO_3$). Although the thicknesses of the first piezoelectric layer 7a, the second piezoelectric layer 9a, and the third piezoelectric layer 11a in the Z-axis direction are not particularly limited, the thicknesses can be, for example, 1 μm to 10 μm. The first piezoelectric layer 7a, the second piezoelectric layer 9a, and the third piezoelectric layer 11a have spontaneously polarized components in the thickness direction, respectively. Additionally, in the present embodiment, the first piezoelectric layer 7a, the second piezoelectric layer 9a, and the third piezoelectric layer 11a are integrally formed, and have spontaneously polarized components with the same size and orientation, respectively.

The first upper electrode layer 7b and the first lower electrode layer 7c are a pair of electrode layers for applying a voltage to the first piezoelectric layer 7a, the second upper electrode layer 9b and the second lower electrode layer 9c are a pair of electrode layers for applying a voltage to the second piezoelectric layer 9a, and the third upper electrode layer 11b and the third lower electrode layer 11c are a pair of electrode layers for applying a voltage to the third piezoelectric layer 11a. The first upper electrode layer 7b, the first lower electrode layer 7c, the second upper electrode layer 9b, the second lower electrode layer 9c, the third upper electrode layer 11b, and the third lower electrode layer 11c are made of metallic materials, such as platinum (Pt), nickel (Ni), copper (Cu), chromium (Cr), palladium (Pd), and titanium (Ti), respectively.

Although the thicknesses of the first upper electrode layer 7b, the first lower electrode layer 7c, the second upper electrode layer 9b, the second lower electrode layer 9c, the third upper electrode layer 11b, and the third lower electrode layer 11c in the Z-axis direction not particularly limited, the thicknesses can be, for example, 0.01 μm to 5 μm, respectively. Additionally, in the present embodiment, the first upper electrode layer 7b, the second upper electrode layer 9b, and the third upper electrode layer 11b are integrally formed, and the first lower electrode layer 7c, the second lower electrode layer 9c, and the third lower electrode layer 11c are integrally fanned. Therefore, in the present embodiment, the first piezoelectric laminate 7, the second piezoelectric laminate 9, and the displacement portion 11 are integrally formed. Although the thicknesses of the first piezoelectric laminate 7, the second piezoelectric laminate 9, and the displacement portion 11 in the Z-axis direction are not particularly limited, the thicknesses can be, for example, 1 μm to 10 μm.

Additionally, as shown in FIGS. 2 and 4, the first piezoelectric laminate 7 extends along a first imaginary line 7H extending along the XY plane, and the second piezoelectric laminate 9 extends along a second imaginary line 9H extending the XY plane. The first imaginary line 7H is composed of a first imaginary line base end 7HT corresponding to the base end 7T of the first piezoelectric laminate 7, and a first imaginary line front end 7HR corresponding to the front end 7R of the first piezoelectric laminate 7, and extends from a base end point 7HTE corresponding to the base end 7T of the first piezoelectric laminate 7 to a front end point 7HRE corresponding to the front end 7R of the first piezoelectric laminate 7. The second imaginary line 9H is composed of a second imaginary line base end 9HT corresponding to the base end 9T of the second piezoelectric laminate 9, and a second imaginary line front end 9HR corresponding to the front end 9R of the second piezoelectric laminate 9, and extends from a base end point 9HTE corresponding to the base end 9T of the second piezoelectric laminate 9 to a front end point 9HRE corresponding to the front end 9R of the second piezoelectric laminate 9.

Additionally, as shown in FIG. 4, when viewed from the Z-axis direction, the first bonding portion 5A of the bonding layer 5 and the base end 7T of the first piezoelectric laminate 7 overlap each other, and the second bonding portion 5B of the bonding layer 5 and the base end 9T of the second piezoelectric laminate 9 overlap each other. Meanwhile, when viewed from the Z-axis direction, the third bonding portion 5C of the bonding layer 5 is spaced apart from the first piezoelectric laminate 7 and the second piezoelectric laminate 9, and the fourth bonding portion 5D of the bonding layer 5 is spaced apart from the first piezoelectric laminate 7 and the second piezoelectric laminate 9.

Figure 5A:
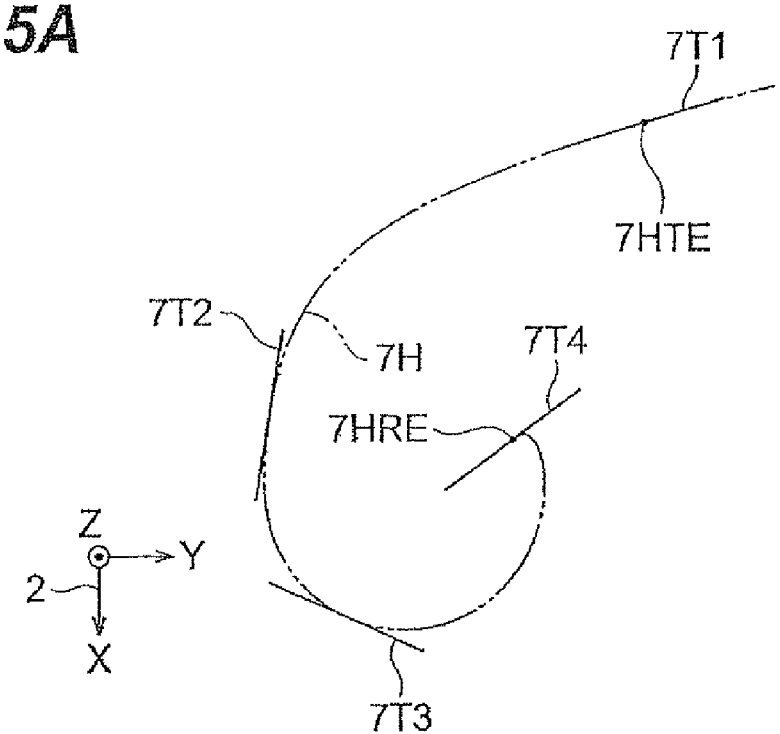
FIG. 5A is a view showing the shape of a first imaginary line corresponding to FIG. 4.
Figure 5B:
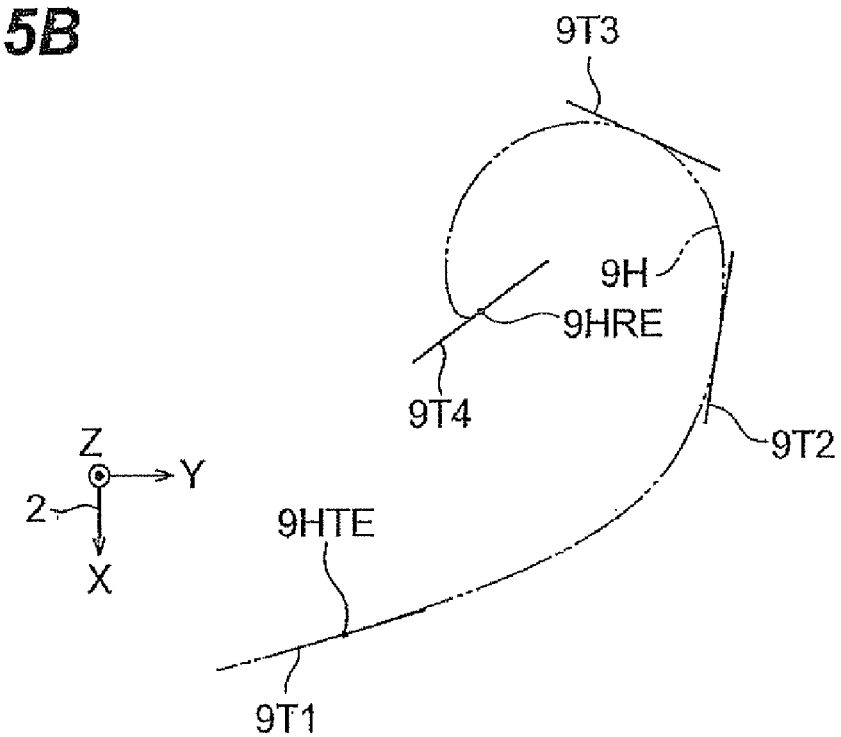
FIG. 5B is a view showing the shape of a second imaginary line corresponding to FIG. 4.

FIG. 5A is a view showing the shape of the first imaginary line corresponding to FIG. 4, and FIG. 5B is a view showing the shape of the second imaginary line corresponding to FIG. 4. Tangent lines 7T1, 7T2, 7T3, and 7T4 in the XY plane at points on the first imaginary line 7H are shown in FIG. 5A. The tangent line 7T1 is a tangent line at the base end point 7HTE, the tangent line 7T2 is a tangent line at a point on the first imaginary line 7H closer to the front end point 7HRE than a tangent point of the tangent line 7T1, the tangent line 7T3 is a tangent line at a point on the first imaginary line 7H closer to the front end point 7HRE than a tangent point of the tangent line 7T2, and the tangent line 7T4 is a tangent line at the front end point 7HRE. As shown in FIG. 5A, the tangent line of the first imaginary line 7H rotates in the clockwise direction (a first rotational direction) in FIG. 5A with the Z-axis as the rotation axis so as to change in order of the tangent line 7T1, the tangent line 7T2, the tangent line 7T3, and the tangent line 7T4, as the tangent point thereof moves toward the front end point 7HRE from the base end point 7HTE.

Additionally, the tangent lines 9T1, 9T2, 9T3, and 9T4 in the XY plane at points on the second imaginary line 9H are shown in FIG. 5B. The tangent line 9T1 is a tangent line at a point near the base end point 9HTE, the tangent line 9T2 is a tangent line at a point on the second imaginary line 9H closer to the front end point 9HRE than a tangent point of the tangent line 9T1, the tangent line 9T3 is a tangent line at a point on the second imaginary line 9H closer to the front end point 9HRE than a tangent point of the tangent line 9T2, and the tangent line 9T4 is a tangent line at the front end point 9HRE. As shown in FIG. 5B, the tangent line of the second imaginary line 9H rotates in the clockwise direction (the first rotational direction) in FIG. 5B with the Z-axis as the rotational axis so as to change in order of the tangent line 9T1, the tangent line 9T2, the tangent line 9T3, and the tangent line 9T4, as the tangent point thereof moves toward the front end point 9HRE from the base end point 9HTE.

Additionally, as shown in FIG. 4, the displacement portion 11 is rectangular as seen from the Z-axis direction in the present embodiment. It is preferable that at least the first imaginary line front end 7HR of the first imaginary line 7H, and at least the second imaginary line front end 9HR of the second imaginary line 9H be arranged substantially point-symmetrically with respect to a central point 11X in the displacement portion 11, as seen from the Z-axis direction.

Subsequently, the first elastic layer 15 and the second elastic layer 17 will be described. As shown in FIGS. 2, 3A, and 3B, the first elastic layer 15 is composed of a first region 15A which is provided on a lower surface 7TD of the base end 7T of the first piezoelectric laminate 7, a second region 15B which is provided on a lower surface 9TD of the base end 9T of the second piezoelectric laminate 9, a third region 15C which is provided on a side surface 7S of the first piezoelectric laminate 7, a fourth region 15D which is provided on a side surface 9S of the second piezoelectric laminate 9, a fifth region 15E which is provided on a lower surface 7RD of the front end 7R of the first piezoelectric laminate 7, a sixth surface region 15F which is provided on a lower surface 9RD of the front end 9R of the second piezoelectric laminate 9, and a seventh region 15G which is provided on a lower surface 11D of the displacement portion 11.

The first elastic layer 15 is provided so as to bury the first piezoelectric laminate 7, the second piezoelectric laminate 9, and the displacement portion 11 in portions other than an upper surface 7U of the first piezoelectric laminate 7, an upper surface 9U of the second piezoelectric laminate 9, and an upper surface 11U of the displacement portion 11. Thereby, the first elastic layer 15 is fixed to the main body 13 so as to connect the lower surface 7TD and lower surface 7RD which face the supporting substrate 3 of the first piezoelectric laminate 7, the lower surface 9TD and lower surface 9RD which face the supporting substrate 3 of the second piezoelectric laminate 9, the lower surface 11D which faces the supporting substrate 3 of the displacement portion 11, a portion of the side surface 7S of the first piezoelectric laminate 7, a portion of the side surface 9S of the second piezoelectric laminate 9, and a portion of the side surface 11S of the displacement portion 11.

The first elastic layer 15 is fixed to the principal surface 3M of the supporting substrate 3 via the bonding layer 5. Specifically, the first region 15A of the first elastic layer 15 is fixed to the principal surface 3M of the supporting substrate 3 via the first bonding portion 5A of the bonding layer 5, the second region 15B of the first elastic layer 15 is fixed to the principal surface 3M of the supporting substrate 3 via the second bonding portion 5B of the bonding layer 5, the third region 15C of the first elastic layer 15 is fixed to the principal surface 3M of the supporting substrate 3 via the third bonding portion 5C of the bonding layer 5, and the fourth region 15D of the first elastic layer 15 is fixed to the principal surface 3M of the supporting substrate 3 via the fourth bonding portion 5D of the bonding layer 5. Thereby, as shown in FIGS. 3A and 3B, a space gap 5G which comes in contact with a non-bonding surface 15R is formed between the non-bonding surfaces 15R, and the principal surface 3M of the supporting substrate 3 other than the face of the lower surface of the first elastic layer 15 which comes in contact with the first bonding portion 5A, the second bonding portion 5B, the third bonding portion 5C, and the fourth bonding portion 5D. In the present embodiment, the height of the space gap 5G in the Z-axis direction is equal to the thickness of the bonding layer 5 in the Z-axis direction.

The first elastic layer 15 is made of, for example, elastic body materials, such as polyimide resin, polyimide silicon resin, silicone resin, epoxy resin, acrylic resin, fluororesin, and BCB (benzocyclobutene) resin. It is preferable that the first elastic layer 15 be made of materials whose modulus of elasticity is lower than that of materials which constitute the main body 13. This is because elastic deformation easily occurs following displacement of the main body 13. Additionally, it is preferable that the first elastic layer 15 be made of a material which exhibits a good bonding property to the main body 13. Additionally, even if the first elastic layer 15 has repeatedly deformed, the first elastic layer 15 preferably has elasticity that the layer does not peel off easily from the main body 13 and has adhesiveness to the main body 13. Although the thickness of the first elastic layer 15 in the Z-axis direction is not particularly limited, the thickness can be, for example, 1 μm to 10 μm in the portion where the first elastic layer does not bury the first piezoelectric laminate 7, the second piezoelectric laminate 9, and the displacement portion 11.

As shown in FIGS. 2, 3A, and 3B, the second elastic layer 17 is formed substantially on the whole upper surface of the main body 13 and the first elastic layer 15. Thereby, the second elastic layer 17 is fixed on the main body 13 so as to connect the first region 15A, the second region 15B, the third region 15C, the fourth region 15D, the upper surface 7U of the first piezoelectric laminate 7, and the upper surface 9U of the second piezoelectric laminate 9 which are regions above the first bonding portion 5A, the second bonding portion 5B, the third bonding portion 5C, and the fourth bonding portion 5D, in the upper surface 15U of the first elastic layer 15. Additionally, an upper portion of the main body 13 of the second elastic layer 17 is formed with a hole portion 17H which passes through the second elastic layer 17 in the thickness direction and has a circular cross-section. Therefore, the displacement portion 11 of the main body 13 is exposed.

Additionally, the second elastic layer 17 is formed with a first slit structure 17S1 and a second slit structure 17S2. The first slit structure 17S1 is composed of a plurality of slits which extend in directions which intersect the first imaginary line 7H, respectively, and are aligned along the first imaginary line 7H. Similarly, the second slit structure 17S2 is composed of a plurality of slits which extend in directions which intersect the second imaginary line 9H, respectively, and are aligned along the second imaginary line 9H.

The purpose of providing such first slit structure 17S1 and second slit structure 17S2 is to make the displacement directions of the first piezoelectric laminate 7 and the second piezoelectric laminate 9 anisotropic and to improve product reliability. More specifically, the second elastic layer 17 which comes in contact with the first piezoelectric laminate 7 and the second piezoelectric laminate 9 aims at protecting products from external environments, such as ambient air, suppressing deterioration of products (peeling-off of a joining interface and reliability degradation) caused by stress applied to the periphery of the joining interface between the main body 13 which becomes a movable portion, and the bonding layer 5 and the first elastic layer 15 which become non-movable portions. In this case, as the material which comes in contact with the first piezoelectric laminate 7 or the second piezoelectric laminate 9 increases, the amount of displacement of the main body 13 may decrease. However, the above purpose can be achieved by providing the first slit structure 17S1 and the second slit structure 17S2 in the second elastic layer 17 which comes in contact with the upper surface of the main body 13, without blocking the displacement of the main body 13. Moreover, since the displacement direction of the main body 13 can be made anisotropic depending on the shape or size of the slits, the controllability of the displacement directions of the main body 13 improves.

The second elastic layer 17 may be made of, for example, thin film materials including metal, ceramic, etc. in addition to resin, such as polyimide, silicone, epoxy, acrylic, and BCB (benzocyclobutene). It is preferable that the second elastic layer 17 be made of materials whose modulus of elasticity is lower than that of the materials which constitute the main body 13. This is because elastic deformation easily occurs following displacement of the main body 13. The second elastic layer 17 may not be provided if the first elastic layer 15 can support and fix the main body 13 and sufficient reliability can be maintained. When the piezoelectric actuator 1 includes the second elastic layer 17, it is not preferable to block the displacement of the main body 13 greatly. When the second elastic layer 17 is constituted as a thin film which is sufficiently thinner than the main body 13 from this viewpoint, the second elastic layer 17 can also be made of materials having a comparatively large modulus of elasticity. However, when the second elastic layer 17 is thicker than the main body 13, it is preferable to make the second elastic layer 17 of materials whose modulus of elasticity is smaller than that of materials which constitutes the main body 13. Although the thickness of the second elastic layer 17 in the Z-axis direction is not particularly limited, the thickness can be, for example, 0.01 µm to 10 µm.

Figure 6:
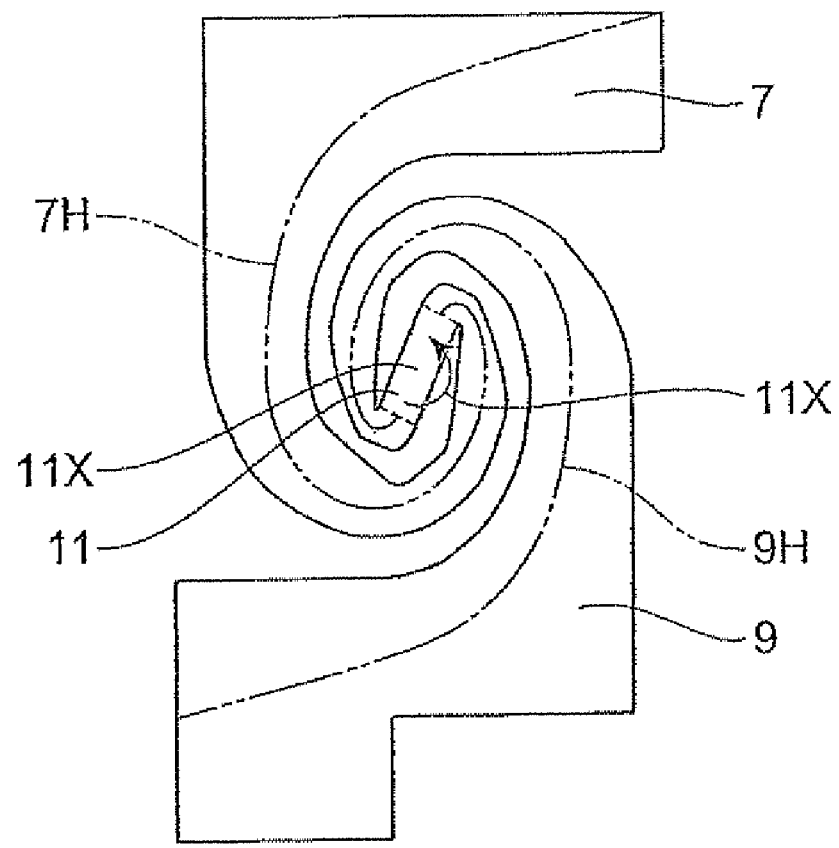
FIG. 6 is a plan view of a main, body.
Figure 11A:
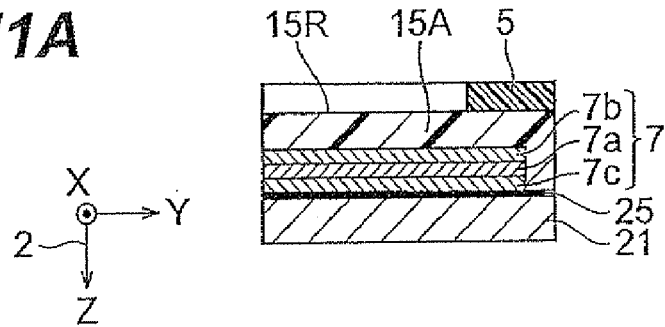
FIG. 11A is the sectional view along a line XIA-XIA of FIG. 10A.
Figure 11B:
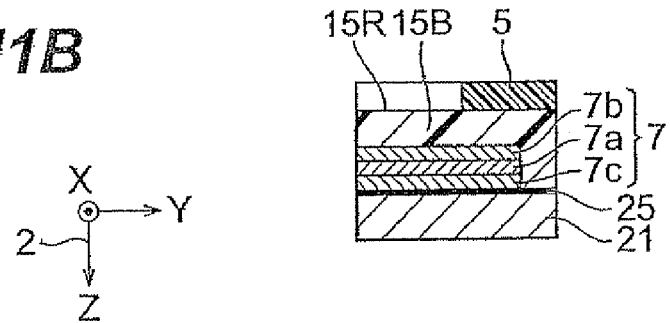
FIG. 11B is a sectional view along a line XIB-XIB of FIG. 10A.
Figure 11C:
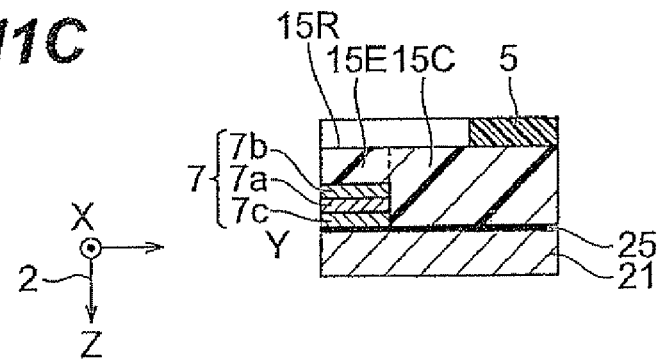
FIG. 11C is a sectional view along a line XIC-XIC of FIG. 10A.
Figure 11D:
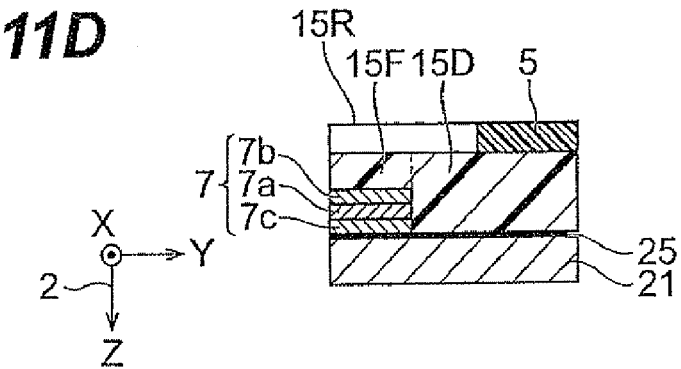
FIG. 11D is a sectional view along a line XID-XID of FIG. 10A.

Next, the operation of the piezoelectric actuator 1 will be described. FIG. 6 is a plan view of the main body. When the piezoelectric actuator 1 is operated, a voltage is applied to between an electrode pad (not shown in FIG. 1 to FIGS. 6A and 6B, and refer to FIGS. 16A and 16B) electrically connected to the first upper electrode layer 7b, the second upper electrode layer 9b, and the third upper electrode layer 11b, and an electrode pad (not shown in FIG. 1 to FIGS. 6A and 6B, and refer to FIGS. 16A and 16B) electrically connected to the first lower electrode layer 7c, the second lower electrode layer 9c, and the third lower electrode layer 11c. Then, the first piezoelectric layer 7a and the second piezoelectric layer 9a are displaced so as to expand or contract in the plane (in the XY plane) thereof according to the polarity of a voltage to apply by the inverse piezoelectric effect. The expansion and contraction in the plane of such a first piezoelectric layer 7a and the second piezoelectric layer 9a becomes the largest in a direction along an extending direction of the first piezoelectric laminate 7 or the second piezoelectric laminate 9, and becomes so large that the length thereof in this extending direction is long. Therefore, the first piezoelectric laminate 7 and the second piezoelectric laminate 9 expands and contracts along the first imaginary line 7H and the second imaginary line 9H, respectively.

In the present embodiment, the first piezoelectric laminate 7 and the second piezoelectric laminate 9 are fixed to the displacement portion 11, respectively, so that the displacement portion 11 is rotated in the rotational direction (the first rotational direction or counterclockwise direction in FIG. 6) shown by an arrow 11Y when the first piezoelectric laminate 7 extends along the first imaginary line 7H by the inverse piezoelectric effect, and simultaneously the second piezoelectric laminate 9 extends along the second imaginary line 9H by the inverse piezoelectric effect. Therefore, when the first piezoelectric laminate 7 and the second piezoelectric laminate 9 are expanded and contracted, the displacement thereof is directly transmitted to the displacement portion 11, and the displacement portion 11 rotates in the first rotational direction, and a rotational direction (clockwise direction in FIG. 6) opposite to the first rotational direction with the central point 11X as a rotation center as seen from the Z-axis direction.

That is, the rotational direction of the displacement portion 11 is determined depending on the direction of expansion or contraction of the first piezoelectric laminate 7 and the second piezoelectric laminate 9. Specifically, when a voltage is applied to the first piezoelectric laminate 7 and the second piezoelectric laminate 9 in the directions of polarization thereof, since the first piezoelectric laminate 7 and the second piezoelectric laminate 9 extend in the thickness direction, and contract in directions along the first imaginary line 7H and the second imaginary line 9H, the displacement portion 11 rotates in a rotational direction shown by an arrow 11Y. On the other hand, when, a voltage is applied to the first piezoelectric laminate 7 and the second piezoelectric laminate 9 in directions opposite to the directions of polarization thereof, since the first piezoelectric laminate 7 and the second piezoelectric laminate 9 contract in the thickness direction, and extends in the directions along the first imaginary line 7H and the second imaginary line 9H, the displacement portion 11 rotates in a direction opposite to the rotational direction shown by the arrow 11Y.

According to the piezoelectric actuator 1 of the embodiment as described above, due to the following reasons, structure is simple, the transmission efficiency of displacement is high, and the displacement portion 11 which is a displacement target can be precisely displaced while the amount of displacement of the displacement portion 11 which is a displacement target is increased.

In the piezoelectric actuator 1 of the present embodiment, the first piezoelectric laminate 7 is fixed to the principal surface 3M of the supporting substrate 3 by the first bonding portion 5A via the first region 15A of the first elastic layer 15 only at the base end 7T, and the second piezoelectric laminate 9 is fixed to the principal surface 3M of the supporting substrate 3 by the second bonding portion 5B via the second region 15B of the first elastic layer 15 only at the base end 9T, and the first piezoelectric laminate 7 and the second piezoelectric laminate 9 are fixed above the principal surface 3M of the supporting substrate 3 (refer to FIGS. 2 to 4).

Additionally, the first elastic layer 15 is fixed to the lower surfaces 7TD, 7RD, 9TD, and 9RD and side surfaces 7S and 9S of the first piezoelectric laminate 7 and second piezoelectric laminate 9, and a space gap 5G which comes in contact with the non-bonding surface 15R is formed between the non-bonding surface 15R of the first elastic layer 15, and the principal surface 3M of the supporting substrate 3. Thereby, the first piezoelectric laminate 7 and the second piezoelectric laminate 9 are not fixed to a high-rigidity member for support in portions other than the base ends 7T and 9T thereof. Therefore, the displacement of the first piezoelectric laminate 7 or the second piezoelectric laminate 9 is not hindered by the high-rigidity member. Additionally, the displacement portion 11 which is a displacement target is directly fixed between the front end 7R of the first piezoelectric laminate 7 and the front end 9R of the second piezoelectric laminate 9. As a result, the piezoelectric actuator 1 of the present embodiment has a simple structure and high transmission efficiency of displacement.

Additionally, the piezoelectric actuator 1 of the present embodiment includes the first elastic layer 15 which connects the lower surfaces 7TD, 7RD, 9TD, and 9RD of the first piezoelectric laminate 7 and the second piezoelectric laminate 9, and the side surfaces 7S and 9S of the first piezoelectric laminate 7 and second piezoelectric laminate 9, and the first elastic layer 15 is fixed to the principal surface 3M of the supporting substrate 3 in the first region 15A, the second region 15B, the third region 15C, and the fourth region 15D (refer to FIGS. 2 to 4). Thereby, the lower surface 7RD, 9RD and side surfaces 7S and 9S of the front end 7R of the first piezoelectric laminate 7 and front end 9R of the second piezoelectric laminate 9 are indirectly supported by the principal surface 3M of the supporting substrate 3 via the first elastic layer 15. Additionally, since the first elastic layer is made of an elastic material, the displacement of the first piezoelectric laminate 7 and the second piezoelectric laminate 9 is hardly hindered, compared to a case where the lower surfaces 7RD and 9RD or side surfaces 7S and 9S of the front end 7R of the first piezoelectric laminate and front end 9R of the second piezoelectric laminate are directly supported by a high-rigidity member.

Thereby, even if the first piezoelectric laminate 7 and the second piezoelectric laminate 9 have shapes which extend for long along the first imaginary line 7H and the second imaginary line 9H, respectively, the first piezoelectric laminate 7 and the second piezoelectric laminate 9 can be sufficiently supported by the supporting substrate 3. Therefore, it is possible to suppress a situation where the first piezoelectric laminate and the second piezoelectric laminate may be displaced independently of an inverse piezoelectric effect (for example, as shown in FIG. 6, a situation where the displacement portion 11 rotates in the XY plane or is displaced in the Z-axis direction while a voltage is not applied to the first piezoelectric laminate 7 or the second piezoelectric laminate 9), or a situation where the first piezoelectric laminate and the second piezoelectric laminate may be displaced in an unexpected mode (for example, as shown in FIG. 6, the displacement portion 11 is displaced in the Z-axis direction, or the first piezoelectric laminate 7 and the second piezoelectric laminate 9 may be greatly displaced in directions intersecting the first imaginary line 7H and the second imaginary line 9H, respectively, when the first piezoelectric laminate 7 and the second piezoelectric laminate 9 are expanded and contracted by the inverse piezoelectric effect). As a result, the piezoelectric actuator 1 of the present embodiment allows for the compatibility between increasing the amount of displacement of the displacement portion 11 which is a displacement target, and displacing the displacement portion 11 precisely.

For the above reasons, according to the piezoelectric actuator 1 of the present embodiment, structure is simple, the transmission efficiency of displacement is high, and the displacement portion 11 which is a displacement target can be precisely displaced while the amount of displacement of the displacement portion 11 which is a displacement target is increased.

Moreover, in the piezoelectric actuator 1 of the present embodiment, the tangent lines 7T1, 7T2, 7T3, and 7T4 of the first imaginary line 7H rotate in the rotational direction (the first rotational direction) having the Z-axis direction as a rotational axis, in a plane parallel to the principal surface 3M of the supporting substrate 3, as the tangent point thereof moves from the base end point 7HTE of the first imaginary line 7H corresponding to the base end 7T of the first piezoelectric laminate 7 toward the front end point 7HRE corresponding to the front end 7R of the first piezoelectric laminate 7, and the tangent lines 9T1, 9T2, 9T3, and 9T4 of the second imaginary line 9H rotates in the rotational direction (the first rotational direction) having the Z-axis direction as a rotational axis, in the plane parallel to the principal surface 3M of the supporting substrate 3, as the tangent point thereof moves from the base end point 9HTE of the second imaginary line 9H corresponding to the base end 9T of the second piezoelectric laminate 9 toward the front end point 9HRE thereof corresponding to the front end 9R of the second piezoelectric laminate 9 (refer to FIGS. 4, 5A, and 5B).

Therefore, the first piezoelectric laminate 7 and the second piezoelectric laminate 9 have shapes which extend while curvilinearly bending in the rotational direction (the first rotational direction) having the Z-axis direction as a rotational axis (refer to FIGS. 4, 5A, and 5B). Therefore, the shape of the whole piezoelectric actuator 1 can be made small while keeping equal the amount of displacement of the displacement portion 11, as compared to a case where the first piezoelectric laminate 7 and the second piezoelectric laminate 9 have shapes which linearly extend by the same length. In addition, if a tangent line in some portions of the first imaginary line 7H rotates in the rotational direction (the first rotational direction) having the Z-axis direction as a rotational axis as the tangent point thereof moves from the base end point 7HTE of the first imaginary line 7H corresponding to the base end 7T of the first piezoelectric laminate 7 toward the front end point 7HRE thereof corresponding to the front end 7R of the first piezoelectric laminate 7, it is possible to obtain the effect that the shape of the whole piezoelectric actuator 1 can be made small while keeping equal the amount of displacement of the displacement portion 11. Similarly, if a tangent line in some portions of the second imaginary line 9H rotates in the rotational direction (the first rotational direction) having the Z-axis direction as a rotational axis as the tangent point thereof moves from the base end point 9HTE of the second imaginary line 9H corresponding to the base end 9T of the second piezoelectric laminate 9 toward the front end point 9HRE thereof corresponding to the front end 9R of the second piezoelectric laminate 9, it is possible to obtain the effect that the shape of the whole piezoelectric actuator 1 can be made small while keeping equal the amount of displacement of the displacement portion 11.

Additionally, in the piezoelectric actuator 1 of the present embodiment, the first piezoelectric laminate 7 and the second piezoelectric laminate 9 are fixed to the displacement portion 11, respectively, so that the displacement portion 11 is rotated in the first rotational direction having the Z-axis direction as a rotational axis (refer to FIG. 6) when the first piezoelectric laminate 7 extends along the first imaginary line 7H by the inverse piezoelectric effect, and simultaneously the second piezoelectric laminate 9 extends along the second imaginary line 9H by the inverse piezoelectric effect, and the first piezoelectric laminate 7 and the second piezoelectric laminate 9 have shapes which extend while curvilinearly bending along the first rotational direction having the Z-axis direction as a rotational axis as described above. Thereby, when the first piezoelectric laminate 7 is expanded and contracted along the first imaginary line 7H, the front end 7R of the first piezoelectric laminate 7 expands and contracts along the first rotational direction. Similarly, when the second piezoelectric laminate 9 is expanded and contracted along the second imaginary line 9H, the front end 9R of the second piezoelectric laminate 9 expands and contracts along the first rotational direction. As a result, the transmission efficiency of the displacement when the displacement portion 11 is rotated becomes much higher.

Moreover, in the piezoelectric actuator 1 of the present embodiment, preferably, at least the first imaginary line front end 7HR of the first imaginary line 7H, and at least the second imaginary line front end 9HR of the second imaginary line 9H are arranged substantially point-symmetrically with respect to a central point 11X in the displacement portion 11, as seen from the Z-axis direction (refer to FIGS. 4 and 6).

In this case, the front end 7R of the first piezoelectric laminate 7 and the front end 9R of the second piezoelectric laminate 9 expand and contract substantially point-symmetrically with respect to the central point 11X in the displacement portion 11 by the inverse piezoelectric effect. Therefore, the transmission efficiency of the displacement when the displacement portion 11 is rotated becomes much higher.

Moreover, in the piezoelectric actuator 1 of the present embodiment, the displacement portion 11 includes the third upper electrode layer 11b, the third lower electrode layer 11c, and the third piezoelectric layer 11a, the first piezoelectric layer 7a, the second piezoelectric layer 9a, and the third piezoelectric layer 11a are integrally formed, the first upper electrode layer 7b, the second upper electrode layer 9b, and the third upper electrode layer 11b are integrally formed, and the first lower electrode layer 7c, the second lower electrode layer 9c, and the third lower electrode layer 11c are integrally formed (refer to FIGS. 2 to 4). Therefore, the first piezoelectric laminate 7, the second piezoelectric laminate 9, and the displacement portion 11 are integrally formed. Thereby, in order to expand and contract the first piezoelectric laminate 7 and the second piezoelectric laminate 9 by the inverse piezoelectric effect, it is only necessary to apply a voltage to between any of the first upper electrode layer 7b, the second upper electrode layer 9b, and the third upper electrode layer 11b, and any of the first lower electrode layer 7c, the second lower electrode layer 9c and the third lower electrode layer 11c. Therefore, the overall structure of the piezoelectric actuator 1 can be simplified (refer to FIGS. 16A and 16B).

Moreover, in the piezoelectric actuator 1 of the present embodiment, the second elastic layer 17 is formed with the first slit structure 17S1 composed of a plurality of slits which extend in directions which intersect the first imaginary line 7H, respectively, and are aligned along the first imaginary line 7H, and the second slit structure 17S2 composed of a plurality of slits which extend in directions which intersect the second imaginary line 9H, respectively, and are aligned along the second imaginary line 9H (refer to FIG. 1 to FIGS. 3A and 3B). Thereby, the first piezoelectric laminate 7 easily expands and contracts along the first imaginary line 7H by the inverse piezoelectric effect, and the second piezoelectric laminate 9 easily expands and contracts along the second imaginary line 9H by the inverse piezoelectric effect. As a result, it is possible to further increase the transmission efficiency of displacement.

Next, a method of manufacturing the piezoelectric actuator according to the present embodiment will be described. As for the piezoelectric actuator according to the present embodiment, usually, a number of piezoelectric actuators are simultaneously manufactured using a large-sized temporary substrate. In the following description, however, a case where one piezoelectric actuator is manufactured will mainly be described.

Figure 12B:
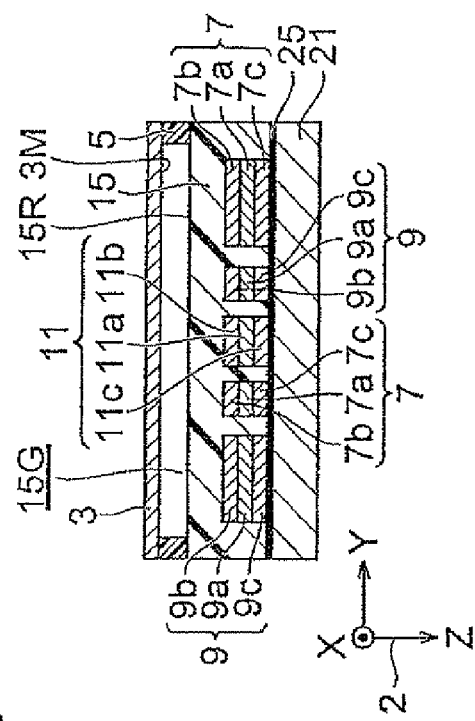
FIG. 12B is a sectional view along a line XIIB-XIIB of FIG. 12A.
Figure 14A:
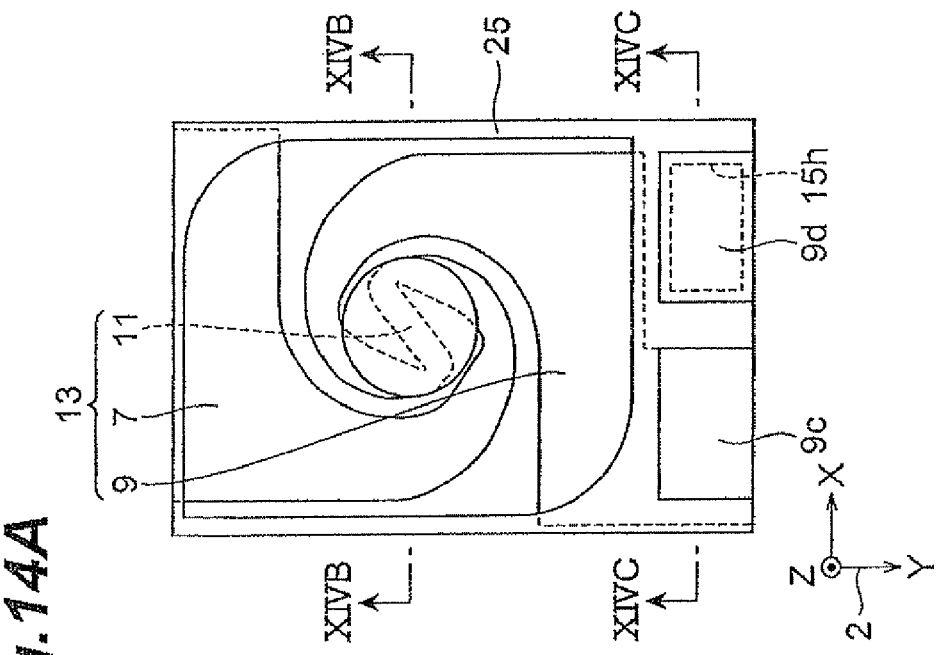
FIG. 14A is a plan view for explaining the method of manufacturing the piezoelectric actuator of the embodiment.
Figure 14B:
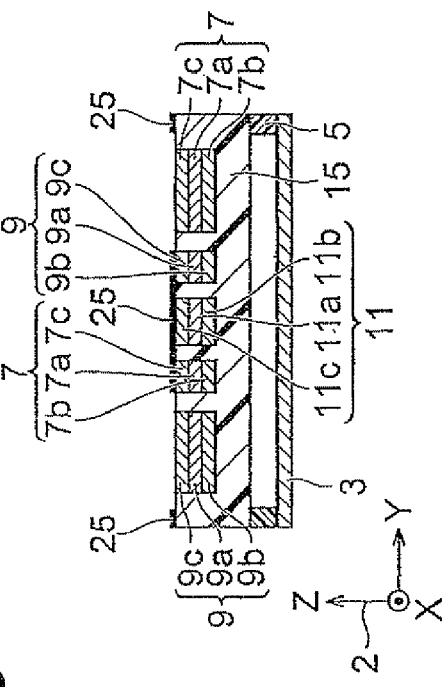
FIG. 14B is a sectional view along a line XIVB-XIVB of FIG. 14A.
Figure 14C:
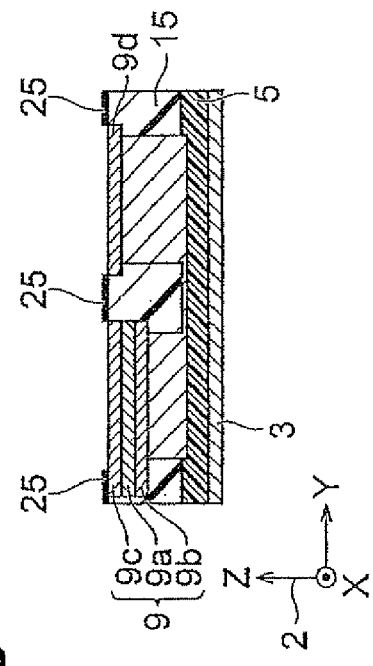
FIG. 14C is a sectional view along a line XIVC-XIVC of FIG. 14A.

FIGS. 7A, 8A, 9A, 10A, 12A, 13A, 14A, 15A, and 16A are plan views for explaining the method of manufacturing the piezoelectric actuator of the present embodiment. FIGS. 7B, 7C, 8B, and 8C are respectively sectional views along a line VIIB-VIIB and a line VIIC-VIIC in FIG. 7A and along a line VIIIB-VIIIB and a line VIIIC-VIIIC in FIG. 5A, FIG. 9B is a sectional view along a line IXB-IXB in FIG. 9A, FIGS. 10B, 11A, 11B, 11C, and 11D are respectively sectional views along a line XB-XB, a line XIA-XIA line, a line XIB-XIB, a line XIC-XIC, and a line XID-XID in FIG. 10A, FIGS. 12B and 13B are respectively sectional views along a line XIIB-XIIB in FIG. 12A and along a line XIIIB-XIIIB in FIG. 13A, FIGS. 14B and 14C are respectively sectional views along a line XIVB-XIVB and a line XIVC-XIVC in FIG. 14A, and FIGS. 15B and 16B are respectively sectional views along a line XVB-XVB in FIG. 15A and a line XVIB-XVIB of FIG. 16A.

(Main Body Forming Step)

In the method of manufacturing the piezoelectric actuator of the present embodiment, first, as shown in FIGS. 7A, 7B, and 7C, the buffer layer 25, the main body 13 having the first piezoelectric laminate 7, the second piezoelectric laminate 9, and the displacement portion 11, and the metal layer 9d are sequentially laminated on the temporary substrate 21, for example, using a physical vapor deposition method such as a vapor deposition method and a sputtering method, a chemical solution process of applying an organic metal compound solution on a substrate, heating the solution, and performing thermal decomposition of the solution by MOD (Metal Organic Decomposition) method, or a method of mixing material particulates with gas to obtain aerosol, making the aerosol collide with a substrate at a high speed, and combining the substrate and the particulates or combining the particulates, using released kinetic energy. An epitaxial growth method can be used for the lamination of these layers. More specifically, the buffer layer 25 is first made to grow epitaxially on the temporary substrate 21. The buffer layer 25 can be oriented, for example, in the (100) direction, the (010) direction, or the (001) direction, and can be an epitaxial growth film of which the upper surface is a {111} facet.

Subsequently, a main-body lower electrode layer (the first lower electrode layer 7c, the second lower electrode layer 9c, and the third lower electrode layer 11c), and a main-body piezoelectric layer (the first piezoelectric layer 7a, the second piezoelectric layer 9a, and the third piezoelectric layer 11a) are sequentially made to grow epitaxially on the buffer layer 25, and a main body upper electrode layer (the first upper electrode layer 7b, the second upper electrode layer 9b, and the third upper electrode layer 11b) is further formed on the main-body piezoelectric layer. In addition, this main-body upper electrode layer may not be an epitaxial growth film. Thereby, a laminate composed of the temporary substrate 21, the buffer layer 25, the main-body lower electrode layer, the main-body piezoelectric layer, and the main-body upper electrode layer is formed. Since the main-body piezoelectric layer becomes an oriented piezoelectric crystal film of which the crystal orientation direction is arranged in the polarization direction (001) by the effect of the buffer layer 25 as a seed layer, main-body piezoelectric layer has spontaneous polarization.

A crystalline substrate made of, for example, silicone (Si), magnesium oxide (MgO), etc. can be used as the temporary substrate 21. As a material which constitutes the buffer layer 25, for example, oxide such as zirconia can be used. The buffer layer 25 is provided in order to control lattice-constant matching between the temporary substrate 21 and the main-body piezoelectric layer, and control the orientation direction of the main-body piezoelectric layer.

The first piezoelectric laminate 7 includes the first upper electrode layer 7b, the first lower electrode layer 7c, and the first piezoelectric layer 7a interposed between the electrode layers. The second piezoelectric laminate 9 includes the second upper electrode layer 9b, the second lower electrode layer 9c, and the second piezoelectric layer 9a interposed between the electrode layers. The displacement portion 11 includes the third upper electrode layer 11b, the third lower electrode layer 11c, and the third piezoelectric layer 11a interposed between the electrode layers. The first piezoelectric layer 7a, the second piezoelectric layer 9a, and the third piezoelectric layer 11a are integrally formed, the first upper electrode layer 7b, the second upper electrode layer 9b, and the third upper electrode layer 11b are integrally formed, and the first lower electrode layer 7c, the second lower electrode layer 9c, and the third lower electrode layer 11c are integrally formed. The first piezoelectric laminate 7 extends along the first imaginary line 7H, and the second piezoelectric laminate 9 extends along the second imaginary line 9H. The metal layer 9d is provided at a position apart from the main body 13 and close to the second piezoelectric laminate 9.

Such a main body 13 can be formed, for example, by forming a layer made of the same material as the first lower electrode layer 7c, the second lower electrode layer 9c, and the third lower electrode layer 11c, a layer made of the same material as the first piezoelectric layer 7a, the second piezoelectric layer 9a, and the third piezoelectric layer 11a, and a layer made of the same material as the first upper electrode layer 7b, the second upper electrode layer 9b, and the third upper electrode layer 11b in this order on the whole surface of the temporary substrate 21, and working the obtained main body into a predetermined shape by photolithography. The metal layer 9d can be formed from, for example, the same material as the second lower electrode layer 9c, and can be fowled in a predetermined shape at a predetermined position by photolithography.

(First Elastic Layer Forming Step)

Subsequently, as shown in FIGS. 8A, 8B, and 8C, the first elastic layer 15 is formed so as to cover the main body 13. In this case, two through holes 15h are formed in the first elastic layer 15 so as to expose at least a portion of the metal layer 9d and at least a portion of the second upper electrode layer 9b. The formation of the first elastic layer 15 can be performed by, for example, a spin coating method. This makes the upper surface of the first elastic layer 15 substantially flat. The main body 13 is buried in the first elastic layer 15. Additionally, the first elastic layer 15 is composed of the first region 15A which is provided on the base end 7T of the first piezoelectric laminate 7, the second region 15B which is provided on the base end 9T of the second piezoelectric laminate 9, the third region 15C which is provided on the side surface of the first piezoelectric laminate 7, the fourth region 15D which is provided on the side surface of the second piezoelectric laminate 9, the fifth region 15E which is provided on the front end 7R of the first piezoelectric laminate 7, the sixth surface region 15F which is provided on the front end 9R of the second piezoelectric laminate 9, and the seventh region 15G which is provided on the displacement portion 11.

(Electrical Connecting Step)

Subsequently, as shown in FIGS. 9A, 9B, and 9C, a metallic conductor layer 23 made of, for example, silver (Ag), nickel (Ni), chromium (Cr), copper (Cu), etc. is formed from exposed metal layer 9d to exposed second upper electrode layer 9b by, for example, a vacuum deposition method, a physical vapor growth method such as a sputtering method, electrolytic plating, printing of conductive resin, etc. so as to electrically connect the metal layer 9d and the second upper electrode layer 9b via the two through holes 15h.

(Bonding Layer Forming Step)

Subsequently, as shown in FIGS. 10A and 10B and FIGS. 11A, 11B, 11C, and 11D, the bonding layer 5 is formed on the first elastic layer 15. The bonding layer 5 has a pattern of covering a portion of the first region 15A, a portion of the second region 15B, a portion of the third region 15C, and a portion of the fourth region 15D in the first elastic layer 15, and exposing the first elastic layer 15 (the non-bonding surface 15R) other than these regions.

The bonding layer 5 having such a pattern can be formed by forming the bonding layer 5 on the whole surface of the first elastic layer 15, then exposing and developing the bonding layer 5, and then working the bonding layer into a predetermined shape, for example, when a photosensitive material is used as a material which forms the bonding layer 5. Additionally, when a non-photosensitive material is used as a material which forms the bonding layer 5, the bonding layer 5 having the pattern described above can be formed by forming the bonding layer 5 on the whole surface of the first elastic layer 15, forming a resist layer on the bonding layer, and working the bonding layer 5 into a predetermined shape by photolithography.

(Supporting Substrate Fixing Step)

Figure 12A:
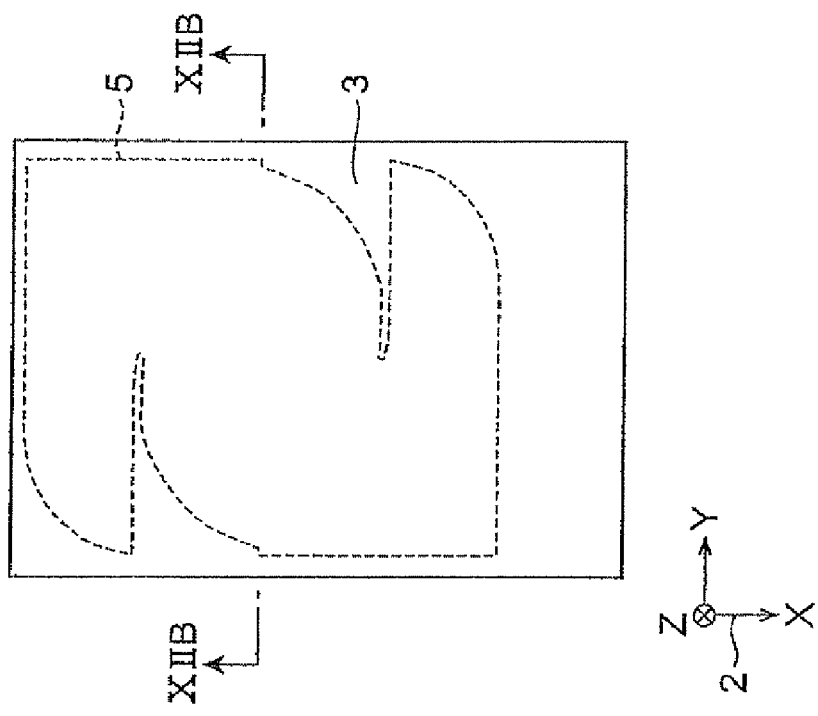
FIG. 12A is a plan view for explaining the method of manufacturing the piezoelectric actuator of the embodiment.

Subsequently, as shown in FIGS. 12A and 12B, the supporting substrate 3 is fixed on the bonding layer 5. Fixation of the supporting substrate 3 onto the bonding layer 5 can be performed, for example, by heating the bonding layer 5 with the supporting substrate 3 pressed against the bonding layer 5. This forms the space gap 5G, which comes in contact with the non-bonding surface 15R, between the non-bonding surface 15R and the principal surface 3M of the supporting substrate 3.

(Temporary Substrate Removing Step)

Then, as shown in FIGS. 13A and 13B, the temporary substrate 21 is removed. This exposes the buffer layer 25. The removal of the temporary substrate 21 can be performed by, for example, a reactive-ion etching (RIE) method or a wet etching method. Since the buffer layer 25 is made of an oxide film such as zirconia, the buffer layer 25 functions as a barrier layer (etching stopper layer) when the temporary substrate 21 is removed by etching in this step.

(Buffer Layer Removing Step)

Subsequently, as shown in FIGS. 14A and 14B, the predetermined place of the buffer layer 25 exposed after the temporary substrate removing step is removed by photolithography and an etching process. This removes the buffer layer 25 in regions other than a region above the displacement portion 11, a region above the base end of the first piezoelectric laminate 7, a region above the base end of the second piezoelectric laminate 9, and a region above the through holes 15h.

(Electrode Pad Forming Step)

Subsequently, as shown in FIGS. 15A and 15B, two electrode pads 27 made of metallic conductors, such as gold (Au) and silver (Ag) are formed on the second lower electrode layer 9c and the metal layers 9d above the two second through holes 15h by, for example, a vacuum deposition method, a physical vapor growth method such as a sputtering method, electrolytic plating, printing of conductive resin, etc. Thereby, one electrode pad 27 is electrically connected to the first lower electrode layer 7c, the second lower electrode layer 9c, and the third lower electrode layer 11c, and the other electrode pad 27 is electrically connected to the first upper electrode layer 7b, the second upper electrode layer 9b, and the third upper electrode layer 11b.

(Second Elastic Layer Forming Step)

Subsequently, as shown in FIGS. 16A and 16B, the second elastic layer 17 is formed on the first piezoelectric laminate 7, the second piezoelectric laminate 9, the displacement portion 11, and the first elastic layer 15, which have been exposed by removing the temporary substrate 21 in the temporary substrate removing step. In this case, a region above the bonding layer 5, the upper surface of the first piezoelectric laminate 7, and the upper surface of the second piezoelectric laminate 9 in the exposed surface of the first elastic layer 15 are connected together by the second elastic layer 17. Additionally, the second elastic layer 17 is formed with the first slit structure 17S1 and the second slit structure 17S2. The formation of such a second elastic layer 17 can be performed, for example, by forming the second elastic layer 17 on the whole surface by a spin coating method, and then working the second elastic layer 17 into a predetermined shape by photolithography. Thereafter, formation of an individual piece for every individual element is performed by performing dicing. The piezoelectric actuator 1 of the present embodiment is manufactured through such steps.

According to the method of manufacturing the piezoelectric actuator of the present embodiment, since the obtained piezoelectric actuator 1 has the features described above, structure is simple, the transmission efficiency of displacement is high, and a displacement target can be precisely displaced while the amount of displacement of the displacement target is increased.

The present invention is not limited to the above embodiment, and various modifications thereof are possible.

For example, although the first piezoelectric laminate 7, the second piezoelectric laminate 9, and the displacement portion 11 are integrally formed in the above-described embodiment (refer to FIGS. 2, 3A, and 3B), these may be separate members. In this case, the displacement portion 11 may not have the piezoelectric layer (the third piezoelectric layer 11a). Additionally, in this case, the first piezoelectric laminate 7 and the second piezoelectric laminate 9 can be displaced in individual forms (for example, a form in which the other piezoelectric laminate contracts along the extending direction thereof by the inverse piezoelectric effect when one piezoelectric laminate expands along the extending direction thereof by the inverse piezoelectric effect) by providing the piezoelectric actuator 1 with one pair of first electrode pads for applying a voltage to the first piezoelectric laminate 7 and one pair of second electrode pads for applying a voltage to the second piezoelectric laminate 9. Thereby, for example, the displacement portion 11 can be linearly displaced in a direction parallel to the principal surface 3M of the supporting substrate 3. That is, the first piezoelectric laminate 7 and the second piezoelectric laminate 9 may be fixed to the displacement portion 11, respectively, so that the displacement portion 11 is linearly displaced in the direction parallel to the principal surface 3M of the supporting substrate 3.

Additionally, although the first imaginary line 7H is curvilinear in the above-described embodiment, the first imaginary line may be a straight line. That is, the first piezoelectric laminate 7 may have a shape which linearly extends in a plane parallel to the principal surface 3M of the supporting substrate 3. Similarly, although the second imaginary line 9H is curvilinear in the above-described embodiment, the second imaginary line may be a straight line. That is, the second piezoelectric laminate 9 may have a shape which linearly extends in the plane parallel to the principal surface 3M of the supporting substrate 3.

Additionally, in the above-described embodiment, the second elastic layer 17 is formed with the first slit structure 17S1 and the second slit structure 17S2. However, such structures may not be formed in the second elastic layer 17.

Additionally, in the above-described embodiment, the piezoelectric actuator 1 includes the second elastic layer 17. However, piezoelectric actuator may not include the second elastic layer 17.

Additionally, in the above-described embodiment, the space gap 5G is formed between the non-bonding surface 15R, and the principal surface 3M of the supporting substrate 3 (refer to FIGS. 3A and 3B). However, the non-bonding surface 15R may be fixed to the principal surface 3M of the supporting substrate 3 by a member with a lower modulus of elasticity (for example, an elastic member which has rubber elasticity) than the first bonding portion 5A, the second bonding portion 5B, the third bonding portion 5C, and the fourth bonding portion 5D. Even in such a case, the first piezoelectric laminate 7 and the second piezoelectric laminate 9 are not fixed to a high-rigidity member for support in portions other than the base ends 7T and 9T thereof. Therefore, displacement of the first piezoelectric laminate 7 or the second piezoelectric laminate 9 is not hindered by the high-rigidity member. As a result, it is possible to provide a piezoelectric actuator with simple structure and a high transmission efficiency of displacement.

Additionally, in the piezoelectric actuators 1 described above, the space gap 5G may be filled with a member made of an organic material, an inorganic material, a metallic material, etc if the non-bonding surface 15R, and the principal surface 3M of the supporting substrate 3 are not fixed. For example, when the space gap 5G is buried by a member whose coefficient of dynamic friction with the non-bonding surface 15R is sufficiently low, i.e., when the main body 13 has displaced, it is also possible to adopt a form in which the main body 13 slides in a surface which comes in contact with the member which has buried the space gap 5G. Even in such a case, the first piezoelectric laminate 7 and the second piezoelectric laminate 9 are not fixed to a high-rigidity member for support in portions other than the base ends 7T and 9T thereof. Therefore, displacement of the first piezoelectric laminate 7 or the second piezoelectric laminate 9 is not hindered by the high-rigidity member. As a result, it is possible to obtain a piezoelectric actuator with simple structure and a high transmission efficiency of displacement.

Additionally, the above-described piezoelectric actuator 1 may further include a guide portion for effectively keeping the main body 13 from stretching out in the XY plane when the main body 13 has been displaced. Specifically, the piezoelectric actuator 1 may further include, for example, a frame member serving as the guide portion which approaches or comes in contact with the second elastic layer 17 so as to surround the side surface of the second elastic layer 17 and by which the relative position from the supporting substrate 3 is fixed, as seen the Z-axis. Since the main body 13 is kept from stretching out in the XY plane by providing such a guide portion, the efficiency of rotational displacement of the displacement portion 11 when the main body 13 has been displaced can be improved. In addition, such a guide portion may be fowled integrally with the supporting substrate 3, or may be a member which is separate from the supporting substrate 3 and by which the relative position from the supporting substrate 3 is fixed.

What is claimed is:

1. A piezoelectric actuator comprising:
   a supporting substrate;
   a main body having a first piezoelectric laminate including a first upper electrode layer, a first lower electrode layer, and a first piezoelectric layer interposed between the first upper electrode layer and the first lower electrode layer, a second piezoelectric laminate including a second upper electrode layer, a second lower electrode layer, and a second piezoelectric layer interposed between the second upper electrode layer and the second lower electrode layer, and a displacement portion capable of being displaced relative to the supporting substrate; and
   a first elastic layer,
   wherein the main body is provided above a principal surface of the supporting substrate,
   wherein the first piezoelectric laminate has a direction which intersects the principal surface of the supporting substrate as a lamination direction, and extends along a first imaginary line within a plane parallel to the principal surface of the supporting substrate,
   wherein the second piezoelectric laminate has a direction which intersects the principal surface of the supporting substrate as a lamination direction, extends along a second imaginary line within the plane parallel to the principal surface of the supporting substrate, and is spaced apart from the first piezoelectric laminate,
   wherein the displacement portion is fixed between a front end of the first piezoelectric laminate and a front end of the second piezoelectric laminate,
   wherein the first elastic layer is fixed to the main body so as to connect a lower surface of the first piezoelectric laminate which faces the supporting substrate, a lower surface of the second piezoelectric laminate which faces the supporting substrate, at least a portion of a side surface of the first piezoelectric laminate, and at least a portion of a side surface of the second piezoelectric laminate, wherein a first region of the first elastic layer provided on a lower surface of a base end of the first piezoelectric laminate is fixed to the principal surface of the supporting substrate by a first bonding portion, wherein a second region of the first elastic layer provided on a lower surface of a base end of the second piezoelectric laminate is fixed to the principal surface of the supporting substrate by a second bonding portion, wherein at least a portion of a third region of the first elastic layer provided on a side surface of the first piezoelectric laminate is fixed to the principal surface of the supporting substrate by a third bonding portion, wherein at least a portion of a fourth region of the first elastic layer provided on the side surface of the second piezoelectric laminate is fixed to the principal surface of the supporting substrate by a fourth bonding portion, wherein a non-bonding surface other than surfaces, which come in contact with the first bonding portion, the second bonding portion, the third bonding portion, and the fourth bonding portion, in the lower surface of the first elastic layer which faces the supporting substrate, is not fixed to the principal surface of the supporting substrate, or is fixed to the principal surface of the supporting substrate by a member whose modulus of elasticity is lower than the first bonding portion, the second bonding portion, the third bonding portion, and the fourth bonding portion.

2. The piezoelectric actuator according to claim 1,
wherein a space gap which comes in contact with the non-bonding surface is formed between the non-bonding surface, and the principal surface of the supporting substrate.

3. The piezoelectric actuator according to claim 1, further comprising a second elastic layer fixed to the main body so as to connect regions above the first bonding portion, the second bonding portion, the third bonding portion, and the fourth bonding portion, the upper surface of the first piezoelectric laminate, and the upper surface of the second piezoelectric laminate, in the upper surface of the first elastic layer.

4. The piezoelectric actuator according to claim 3,
wherein the first elastic layer is made of resin, and the second elastic layer is made of resin.

5. The piezoelectric actuator according to claim 1,
wherein a tangent line in at least some portions of the first imaginary line rotates in a rotational direction with a direction which intersects the principal surface of the supporting substrate as a rotational axis, in a plane parallel to the principal surface of the supporting substrate, as the tangent point thereof moves from an end point of the first imaginary line corresponding to the base end of the first piezoelectric laminate toward an end point thereof corresponding to the front end of the first piezoelectric laminate, and wherein a tangent line in at least some portions of the second imaginary line rotates in a rotational direction with a direction which intersects the principal surface of the supporting substrate as a rotational axis, in the plane parallel to the principal surface of the supporting substrate, as the tangent point thereof moves from an end point of the second imaginary line corresponding to the base end of the second piezoelectric laminate toward an end point thereof corresponding to the front end of the second piezoelectric laminate.

6. The piezoelectric actuator according to claim 1,
wherein the first piezoelectric laminate and the second piezoelectric laminate are fixed to the displacement portion, respectively, so that the displacement portion is rotated in a first rotational direction with a direction which intersects the principal surface of the supporting substrate as a rotational axis, when the first piezoelectric laminate extends along the first imaginary line, and simultaneously the second piezoelectric laminate extends along the second imaginary line.

7. The piezoelectric actuator according to claim 6,
wherein a tangent line in at least a portion of the first imaginary line corresponding to the front end of the first piezoelectric laminate rotates in the first rotational direction in the plane parallel to the principal surface of the supporting substrate, as the tangent point thereof moves from an end point of the first imaginary line corresponding to the base end of the first piezoelectric laminate toward an end point thereof corresponding to the front end of the first piezoelectric laminate, and wherein a tangent line in at least a portion of the second imaginary line corresponding to the front end of the second piezoelectric laminate rotates in the first rotational direction in the plane parallel to the principal surface of the supporting substrate, as the tangent point thereof moves from an end point of the second imaginary line corresponding to the base end of the second piezoelectric laminate toward an end point thereof corresponding to the front end of the second piezoelectric laminate.

8. The piezoelectric actuator according to claim 7,
wherein at least the portion of the first imaginary line corresponding to the front end of the first piezoelectric laminate, and at least the portion of the second imaginary line corresponding to the front end of the second piezoelectric laminate are arranged substantially point-symmetrically with respect to a point within the displacement portion as seen from a direction vertical to the principal surface of the supporting substrate.

9. The piezoelectric actuator according to claim 1,
wherein the displacement portion includes a third upper electrode layer, a third lower electrode layer, and a third piezoelectric layer,
the first piezoelectric layer, the second piezoelectric layer, and the third piezoelectric layer are integrally formed,
the first upper electrode layer, the second upper electrode layer, and the third upper electrode layer are integrally formed, and
the first lower electrode layer, the second lower electrode layer, and the third lower electrode layer are integrally formed.

10. The piezoelectric actuator according to claim 3,
wherein the second elastic layer is formed with a first slit structure composed of a plurality of slits which extend in directions which intersect the first imaginary line, respectively, and are aligned along the first imaginary line, and a second slit structure composed of a plurality of slits which extend in directions which intersect the second imaginary line, respectively, and are aligned along the second imaginary line.

11. A method of manufacturing a piezoelectric actuator, the method comprising the steps of:
(a) forming on a temporary substrate, a main body having a first piezoelectric laminate including a first upper electrode layer, a first lower electrode layer, and a first piezoelectric layer interposed between the first upper electrode layer and the first lower electrode layer, and extending along a first imaginary line within a plane parallel to a principal surface of the temporary substrate, a second piezoelectric laminate including a second upper electrode layer, a second lower electrode layer, and a second piezoelectric layer interposed between the second upper electrode layer and the second lower electrode layer, extending along a second imaginary line within the plane parallel to the principal surface of the temporary substrate, and spaced apart from the first piezoelectric laminate, and a displacement portion fixed between a front end of the first piezoelectric laminate and a front end of the second piezoelectric laminate;

(b) forming a first elastic layer on the main body so as to cover the main body;

(c) forming a bonding layer having a pattern which covers a first region of the first elastic layer provided on a base end of the first piezoelectric laminate, a second region of the first elastic layer provided on a base end of the second piezoelectric laminate, at least a portion of a third region of the first elastic layer provided on a side surface of the first piezoelectric laminate, and at least a portion of a fourth region of the first elastic layer provided on the side surface of the second piezoelectric laminate and which exposes the first elastic layer other than these regions;

(d) fixing a supporting substrate on the bonding layer so as to form a space gap which comes in contact with a non-bonding surface between the non-bonding surface of the first elastic layer where the bonding layer is not formed, and the principal surface of the supporting substrate; and (e) removing the temporary substrate.

12. The method of manufacturing a piezoelectric actuator according to claim 11, further comprising the step of:

(f) after step (e), forming a second elastic layer on the first piezoelectric laminate, the second piezoelectric laminate, and the first elastic layer, which have been exposed by removing the temporary substrate in step (e), so as to connect a region above the bonding layer in the exposed surface of the first elastic layer, an upper surface of the first piezoelectric laminate, and an upper surface of the second piezoelectric laminate.

* * * * *